US012555703B2

(12) United States Patent
Chuganey et al.

(10) Patent No.: US 12,555,703 B2
(45) Date of Patent: Feb. 17, 2026

(54) ELECTRICAL CABLE WITH ELECTRICALLY CONDUCTIVE COATING

(71) Applicant: SAMTEC, INC., New Albany, IN (US)

(72) Inventors: Shashi Chuganey, Newberg, OR (US); Yasuo Sasaki, Tsuzuki-Ku (JP); Scott Mcmorrow, New Albany, IN (US); Carol Campos, New Albany, IN (US); Cindy Lee Diegel, Portland, OR (US); James Alexander Moss, Newberg, OR (US); Francisco Noyola, Sherwood, OR (US)

(73) Assignee: SAMTEC, INC., New Albany, IN (US)

(*) Notice: Subject to any disclaimer, the term of this patent is extended or adjusted under 35 U.S.C. 154(b) by 0 days.

(21) Appl. No.: 17/058,946

(22) PCT Filed: May 24, 2019

(86) PCT No.: PCT/US2019/033916
§ 371 (c)(1),
(2) Date: Nov. 25, 2020

(87) PCT Pub. No.: WO2019/226988
PCT Pub. Date: Nov. 28, 2019

(65) Prior Publication Data

US 2021/0217542 A1 Jul. 15, 2021

Related U.S. Application Data

(60) Provisional application No. 62/847,785, filed on May 14, 2019, provisional application No. 62/676,842, filed on May 25, 2018.

(51) Int. Cl.
*H01B 11/00* (2006.01)
*H01B 7/02* (2006.01)
(Continued)

(52) U.S. Cl.
CPC .......... *H01B 11/1821* (2013.01); *H01B 7/02* (2013.01); *H01B 7/0861* (2013.01);
(Continued)

(58) Field of Classification Search
CPC ......................... H01B 11/1821; H01B 7/0861; H01B 7/0892; H01B 7/1895; H01B 7/226;
(Continued)

(56) References Cited

U.S. PATENT DOCUMENTS 3,643,007 A 2/1972 Roberts et al.
3,748,369 A * 7/1973 Durakis ................ H01B 9/027 174/36

(Continued)

FOREIGN PATENT DOCUMENTS

CA 2107355 A1 10/1992
CN 102498527 A 6/2012

(Continued)

OTHER PUBLICATIONS

Chen et al., Gas Absorption with Filled Polymer Systems, Technical Papers and Presentations, MuCell Processes, Trexel Inc., https://www.trexel.com/techpp/gasabs.html, internet webpages dated Nov. 3, 2003, 9 pages.

(Continued)

*Primary Examiner* — Pete T Lee
(74) *Attorney, Agent, or Firm* — BakerHostetler

(57) ABSTRACT

Electrical cables are disclosed can include at least one electrical conductor, an inner electrical insulator that surrounds the at least one electrical conductor, and an electrical shield disposed about the inner electrical insulator. The electrical cables can include an electrically conductive material disposed between adjacent layers of the electrical cable. In one example, an electrical coating can be disposed in the electrical shield, for instance, in regions of overlap. Flow- (Continued)

able electrically conductive materials are also disclosed that can flow into gaps during operation of the electrical cable.

18 Claims, 10 Drawing Sheets

(51) Int. Cl.
*H01B 7/08* (2006.01)
*H01B 7/18* (2006.01)
*H01B 7/22* (2006.01)
*H01B 11/18* (2006.01)
*H01B 11/20* (2006.01)
*H05K 9/00* (2006.01)
*H01P 3/06* (2006.01)

(52) U.S. Cl.
CPC ......... *H01B 7/0892* (2013.01); *H01B 7/1895* (2013.01); *H01B 7/226* (2013.01); *H01B 11/002* (2013.01); *H01B 11/183* (2013.01); *H01B 11/203* (2013.01); *H05K 9/0098* (2013.01); *H01B 7/187* (2013.01); *H01B 7/188* (2013.01); *H01P 3/06* (2013.01)

(58) Field of Classification Search
CPC .... H01B 11/183; H01B 11/203; H01B 7/187; H01B 7/188; H05K 9/0098
See application file for complete search history.

(56) References Cited

U.S. PATENT DOCUMENTS 4,145,567 A 3/1979 Bahder
4,155,613 A 5/1979 Brandeau
4,185,162 A 1/1980 Bogese
4,475,006 A 10/1984 Olyphant
4,963,695 A 10/1990 Marciano-Agostinelli et al.
5,110,998 A 5/1992 Muschiatti
5,158,986 A 10/1992 Cha et al.
5,160,674 A 11/1992 Colton et al.
5,192,834 A 3/1993 Yamanishi et al.
5,227,103 A 7/1993 Muschiatti
5,334,356 A 8/1994 Baldwin et al.
5,684,495 A 11/1997 Dyott et al.
5,866,053 A 2/1999 Park et al.
6,051,174 A 4/2000 Park et al.
6,294,115 B1 9/2001 Blizard et al.
RE37,932 E 12/2002 Baldwin et al.
6,602,064 B1 8/2003 Chen et al.
6,652,786 B2 11/2003 Sanyal
6,693,241 B2 2/2004 Carlson et al.
6,912,777 B2 7/2005 Carlson et al.
8,575,488 B2 11/2013 Sugiyama et al.
8,653,373 B2 * 2/2014 Sugiyama ............ H01B 11/183
174/113 R
8,859,901 B2 10/2014 Gundel
9,040,824 B2 5/2015 Guetig et al.
9,064,621 B2 6/2015 Kaga et al.
9,070,992 B2 6/2015 Hemond et al.
9,153,361 B2 10/2015 Watanabe et al.
9,350,571 B2 5/2016 Watanabe et al.
9,484,127 B2 11/2016 Sugiyama et al.
9,646,740 B2 5/2017 Gundel
9,853,342 B2 12/2017 Henry et al.
9,865,378 B2 1/2018 Gundel
9,985,332 B2 5/2018 Tsukahara et al.
9,991,023 B2 6/2018 Buck et al.
2004/0194996 A1 10/2004 Ysbrand
2005/0008848 A1 1/2005 Saccomanno et al.
2006/0131061 A1 * 6/2006 Seigerschmidt ..... H01B 7/0892
174/117 FF
2007/0001789 A1 1/2007 Suarez-Gartner et al.
2007/0108987 A1 5/2007 Satou et al.
2009/0255706 A1 * 10/2009 Jiang .................. H01B 11/1808
174/102 R
2011/0083877 A1 4/2011 Sugiyama et al.
2011/0100682 A1 5/2011 Nonen et al.
2012/0186850 A1 7/2012 Sugiyama et al.
2013/0087361 A1 4/2013 Kaga et al.
2013/0146326 A1 6/2013 Gundel et al.
2013/0180752 A1 7/2013 Kodama et al.
2013/0277090 A1 10/2013 Nordin et al.
2014/0076608 A1 3/2014 Fukasaku
2014/0090869 A1 4/2014 Kaga et al.
2014/0182881 A1 * 7/2014 Huang ............... H01B 11/1091
174/103
2014/0299348 A1 * 10/2014 Daumand ................ H01B 1/06
174/107
2015/0003540 A1 1/2015 Watanabe et al.
2015/0047874 A1 2/2015 Thuot et al.
2015/0162113 A1 6/2015 Ishikawa et al.
2015/0170800 A1 * 6/2015 Sugiyama .......... H01B 13/0841
156/56
2015/0201488 A1 7/2015 Managaki et al.
2015/0294751 A1 10/2015 Shim et al.
2015/0294761 A1 10/2015 Sugiyama et al.
2016/0036112 A1 2/2016 Sugiyama et al.
2016/0246021 A1 8/2016 Otte et al.
2016/0351298 A1 * 12/2016 Gundel ................ H05K 9/0098
2016/0365175 A1 12/2016 Bennett et al.
2017/0040088 A1 2/2017 Gundel et al.
2017/0085003 A1 3/2017 Johnson et al.
2017/0162300 A1 * 6/2017 Hasan .................... H01B 9/023
2018/0033523 A1 * 2/2018 Kusuma ............... H01B 11/085
2018/0075948 A1 * 3/2018 Kobayashi ............... H01B 7/36
2018/0096755 A1 * 4/2018 Tsujino ................ H01B 7/0241
2018/0115040 A1 4/2018 Bennett et al.
2019/0097293 A1 3/2019 Dogiamis et al.
2019/0198199 A1 6/2019 Gundel
2019/0318841 A1 * 10/2019 Hornung .................. H01B 7/26
2019/0348196 A1 * 11/2019 Hornung ............ H01B 11/1895
2020/0083578 A1 3/2020 Yoshimoto et al.
2021/0383946 A1 12/2021 Chuganey et al.

FOREIGN PATENT DOCUMENTS

CN 103208336 A 7/2013
CN 105474329 A 4/2016
CN 105593730 A 5/2016
CN 106297982 A 1/2017
CN 107658056 A 2/2018
CN 211237751 U 8/2020
EP 0580777 A1 2/1994
EP 0985511 A2 3/2000
EP 2057640 A1 5/2009
EP 3324481 A1 5/2018
JP 06-203664 A 7/1994
JP 06-506724 A 7/1994
JP 2625576 7/1997
JP 3013637 2/2000
JP 2001-035270 A 2/2001
JP 2011-113933 A 6/2011
JP 2013-247011 A 12/2013
JP 2015-133379 A 7/2015
JP 2017-147551 A 8/2017
KR 10-0171911 B1 3/1999
TW 295300 U 1/1997
TW 1244799 B 12/2005
WO 92/17533 A1 10/1992
WO 2008/020694 A1 2/2008
WO 2013/176710 A1 11/2013
WO 2017/017354 A1 2/2017

(56) References Cited

FOREIGN PATENT DOCUMENTS

| | | | |
|---|---|---|---|
| WO | 2018/063388 | A1 | 4/2018 |
| WO | 2018/216636 | A1 | 11/2018 |

OTHER PUBLICATIONS

Chen, et al., Effects of Shear Stress and Pressure Drop Rate on Microcellular Foaming Process, Technical Papers and Presentations, MuCell Processes, Trexel Inc., Internet webpages dated Nov. 3, 2003. 7 pages.
Heraeus Epurio—Conductive Polymers and Ultra-Pure Chemicals for New Advances in Electronics, Home page, https://www.heraeus.com/en/hep/home_ec/home_ec_page.html; 2 pages downloaded from the internet on May 23, 2019.
Heraeus Epurio Clevios (trademark), Clevios (trademark)—PEDOT:PSS, Technical Information; https://www.heraeus.com/en/hep/products_hep/clevios_prod/clevios_1.html, 2 pages, downloaded from internet May 23, 2019.
Hitachi Cable America Inc., High Data Rate Copper Based Direct Attach Cable Assemblies, 25-50-100-200-400 Gbit/s, Product Guide, May 2018, 20 pages.
Kyocera, Silver sintering paste; Semiconductor/Electronic Components Assembly Material; https://global.kyocera.com/prdct/chem/list/scmt/paste/sintering_paste/, 4 pages downloaded from the internet on May 23, 2019.
Liquid Wire, Technology—Liquid Wire, Inc., 2019, 1 page, https://liquidwire.io/technology, internet page dated May 23, 2019.
Shin, et al., Preparation of Silver Nanoparticles in Ultrasonic Vibration-Induced Nanodroplets of Isopropyl Alcohol in Combination with lonic Liquids, Bull. Korean Chem. Soc, vol. 32, No. 5, 2011, 1583-1586.
Sugiyama, et al., Analysis of the Intra-pair Skew Generation Factor in Copper Cable for 25 Gbit/s/ch Transmission, Cable Materials Campany, Hitachi Metals, Ltd, vol. 30, 2014, 46-51.
Sugiyama et al., Analysis of the Intra-pair Skew Generation Factor in Copper Cable for 25 Gbit/s/ch Transmission, Cable Materials Company, Hitachi Metals, Ltd. vol. 30, 2014, 46-51, with English abstract.
Pivit et al., Compact 60-GHz lens antenna with self-alignment feature for small cell backhaul, IEEE-APS Topical Conference on Antennas and Propagation in Wireless Communications published Sep. 1, 2017.
Coonrod J., “Insertion Loss Comparisons of Common High Frequency PCB Constructions”, IPC APEX EXPO Conference Proceedings, Jul. 15, 2012, 7 Pages.

* cited by examiner

ELECTRICAL CABLE WITH ELECTRICALLY CONDUCTIVE COATING

CROSS-REFERENCE TO RELATED APPLICATIONS

This application is the National Stage Application of International Patent Application No. PCT/US2019/033916, filed May 24, 2019 which claims priority to U.S. Patent Application Ser. No. 62/676,842 filed May 25, 2018 and U.S. Patent Application Ser. No. 62/847,785 filed May 14, 2019, the disclosure of each of which is hereby incorporated by reference as if set forth in its entirety herein.

BACKGROUND

Electrical cables are used to electrically connect one electrical component to another electrical component. Referring to FIGS. 1A-1B, electrical cables 20 and 20' respectively typically include at least one electrical conductor 22 surrounded by an inner electrically insulator 24. While FIGS. 1A-1B illustrate coaxial cables having a single electrical conductor, it is recognized that such electrical cables can alternatively be configured as twinaxial cables having a pair of electrical conductors surrounded by the inner electrically insulator 24.

As illustrated in FIG. 1A, the electrical cable 20 can include a plurality of electrically conductive strands 26 that are helically wound about the inner electrical insulator 24 so as to define a serve shield 28 that provides electrical shielding to the at least one electrical conductor 22. The windings of the serve shield 28 can be spaced from each other along the length of the electrical cable 20. Therefore, the serve shield 28 can define a helical electrical path about the inner electrically insulator 24, and therefore about the at least one electrical conductor 22. Accordingly, the electrical cable 20 further includes an aluminized mylar tape 30 that wraps around the serve shield 28 and contacts the windings. In particular, aluminum is vapor deposited onto the mylar tape 30, and an outer jacket is applied so that the aluminized side of the jacket faces the winding. The mylar tape 30 extends continuously along the length of the cable 20. Accordingly, the serve shield 28 in combination with the mylar tape 30 provides an electrical path along the length of the cable 20. The electrical cable 20 includes an outer electrically insulator 32 that surrounds the mylar tape 30.

Referring now to FIG. 1B, in other embodiments in the prior art, the electrical cable 20' includes at least one electrically conductive tape 34 that surrounds the inner electrically insulator 24, and thus also surrounds the at least one electrical conductor 22. The at least one electrically conductive tape 34 thus provides electrical shielding for the at least one electrical conductor 22. The at least one electrically conductive tape 34 can be configured as a single tape or first and second tapes 36 and 38. For instance, one of the tapes 36 and 38 is commonly a copper tape, and the other of the tapes 36 and 38 is commonly a polymer that is aluminized. Either or both of the first and second tapes 36 and 38, respectively, can overlap themselves as they are helically wound so as to define respective overlapped regions when wound about the inner electrical insulator 54 so as to define first and second overlapped region 37 and 39, respectively. The overlapped regions are defined by respective portions of the tape that overlap each other along the radial direction.

What is needed is an electrical cable with improved electrical shielding.

SUMMARY

In accordance with one aspect of the present disclosure, an electrical cable can include an electrically conductive additive that can be usable in combination with an electrical shield in other examples so as to produce an improved electrical cable.

DETAILED DESCRIPTION

The present disclosure can be understood more readily by reference to the following detailed description taken in connection with the accompanying figures and examples, which form a part of this disclosure. It is to be understood that this disclosure is not limited to the specific devices, methods, applications, conditions or parameters described and/or shown herein, and that the terminology used herein is for the purpose of describing particular embodiments by way of example only and is not intended to be limiting of the scope of the present disclosure. Also, as used herein, the singular forms "a," "an," and "the" include "at least one" and a plurality, unless otherwise indicated. Further, reference to a plurality as used herein includes the singular "a," "an," "one," and "the," and further includes "at least one" unless otherwise indicated. Further still, the term "at least one" can include the singular "a," "an," and "the," and further can include a plurality, unless otherwise indicated. Further yet, reference to a particular numerical value in the specification including the appended claims includes at least that particular value, unless otherwise indicated.

The term "plurality", as used herein, means more than one, such as two or more. When a range of values is expressed, another example includes from the one particular value and/or to the other particular value. The words "substantially" and "approximately" as used herein with respect to a shape, size, or other parameter or numerical value includes the stated shape, size, or other parameter or numerical value, and further includes plus and minus 10% of the stated shape, size, or other parameter or numerical value.

Figure 2A:
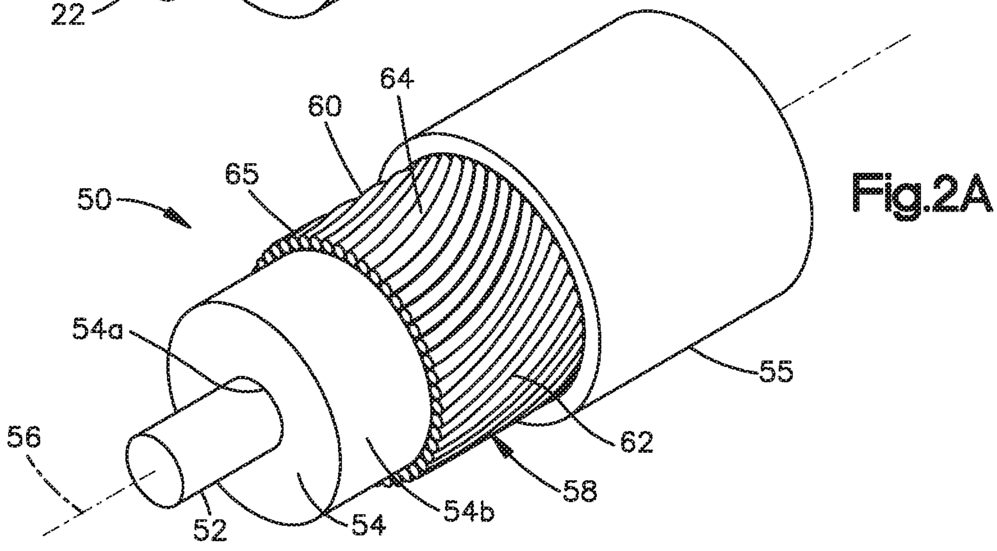
FIG. 2A is a perspective view of an electrical cable constructed in accordance with one example, including an electrical conductor, an inner electrical insulator, a serve shield, and an outer electrical insulator.
Figure 2B:
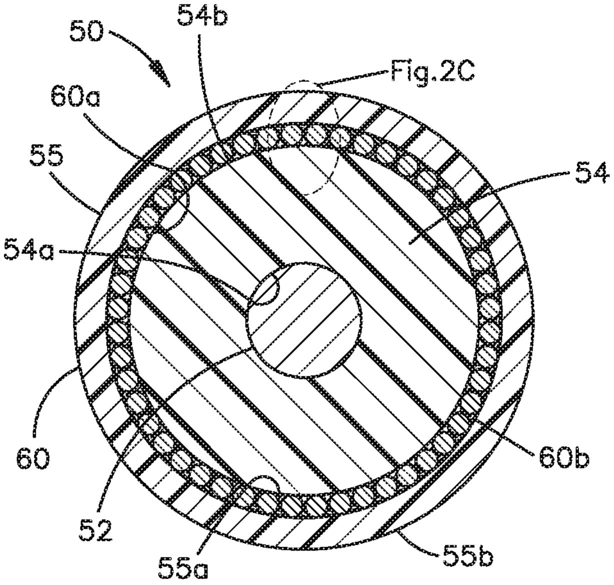
FIG. 2B is a sectional end elevation view of the electrical cable illustrated in FIG. 2A.
Figure 2C:
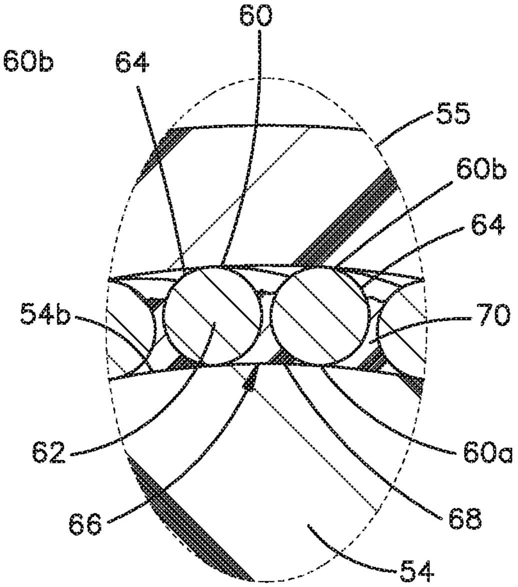
FIG. 2C is an enlarged region of FIG. 2B, taken at line 2C.

Referring now to FIGS. 2A-2C, an electrical cable 50 in accordance with one embodiment includes an electrical conductor 52 and an inner electrical insulator 54 that surrounds the electrical conductor 52. The electrical conductor 52 can be silver plated copper, bare copper, CuNi Alloys, Cu Alloys, Ag Alloys, Tin, Tin Alloys, or any suitable alternative materials. The inner insulator 54 can be FEB solid or foamed, PFA solid or foamed, LDPE, PP, PE, ePTFE tape, PTFE, or any suitable alternative electrical isolator. The electrical conductor 52 can be an electrical signal conductor that is configured to carry electrical signals during operation. The electrical conductor 52 extends along a respective central axis 56 that can be said to extend along an axial direction. Thus, both the electrical conductor 52 and the electrical cable 50 can be said to be elongate along the axial direction. It is recognized that the axial direction can be straight or curved, or can have straight sections and curved sections.

The inner electrical insulator 54 entirely surrounds at least a majority of the length of the electrical conductor 52 with respect to a plane that is oriented perpendicular to the axial direction. Thus, the inner electrical insulator 54 can define a radially inner end 54*a* that faces the electrical conductor 52, and a radially outer end 54*b* opposite the radially inner end 54*a*. The radially inner end 54*a* can be defined by a radially inner surface that faces the electrical conductor 52. The radially outer end 54*b* can be defined by a radially outer surface that is opposite the radially inner surface. In this regard, the term "radially inner" and derivatives thereof as used herein can refer to a direction toward the central axis 56 unless otherwise indicated. The term "radially outer" and derivatives thereof as used herein can refer to a direction away from the central axis 56 unless otherwise indicated. The inner insulator 54 can surround a majority of the length of the electrical conductor 52, such that a portion of the electrical conductor 52 extends axially out from the inner insulator 54 so as to establish an electrical connection with a complementary electrical component, such as an electrical connector, transceiver, printed circuit board, or alternative device. Thus, it can be said that the inner electrical insulator 54 can surround the at least one electrical conductor 52 along at least a portion of a length of the electrical conductor 52. Typically, the inner electrical insulator 54 surrounds the at least one electrical conductor 52 along a majority of its length.

Figure 7A:
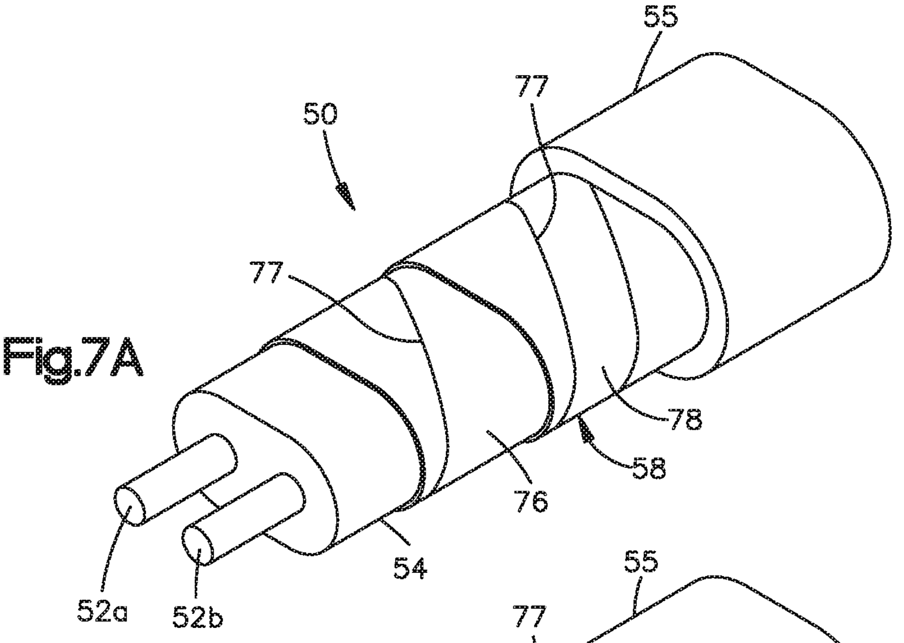
FIG. 7A is a perspective view of an electrical cable constructed similar to FIG. 6A but configured as a twinaxial cable including first and second electrical conductors in accordance with another embodiment.
Figure 7B:
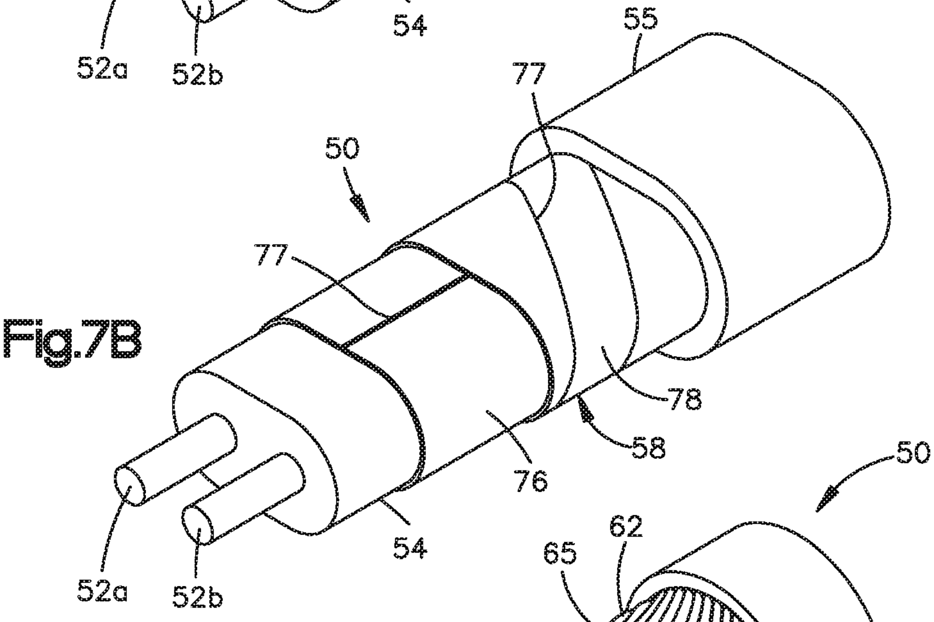
FIG. 7B is a perspective view of an electrical cable constructed similar to FIG. 7A but showing an electrical shield defining a longitudinal wrap in accordance with another embodiment.

As illustrated in FIG. 2A, the electrical cable 50 is a co-axial cable in which the electrical conductor 52 is a single electrical conductor. However, it is recognized that the electrical cable 50 can alternatively be configured as a twinaxial cable in which first and second coextruded electrical conductors 52*a* and 52*b* are surrounded by the inner electrical insulator 54, as illustrated in FIGS. 7A-7B. The first and second signal conductors 52*a* and 52*b* are arranged side-by-side and substantially parallel to each other, and are surrounded by the inner electrical insulator 54 such that the signal conductors 52*a* and 52*b* are electrically isolated from each other. It should be appreciated that all electrical cables described herein can include at least one electrical cable that is surrounded by an inner electrical insulator. The at least one electrical cable can be configured as a single electrical cable, or can alternatively be configured as first and second electrical cables.

With continuing reference to FIGS. 2A-2C, the electrical cable 50 can further include an electrical shield 58 that surrounds the first or inner electrical insulator 54 along at least a majority of the length of the inner electrical insulator along a plane that is normal to the axial direction. The electrical cable 50 can also include a second or outer electrical insulator 55 that surrounds the electrical shield 58 along at least a majority of the length of the electrical shield along a plane that is oriented normal to the axial direction. Thus, the electrical shield 58 is disposed radially between the inner electrical insulator 54 and the outer electrical insulator 55. The outer electrical insulator can be polyvinyl chloride (PVC), a terpolymer including tetrafluoroethylene, hexafluoropropylene and vinylidene fluoride (THV), fluorinated ethylene propylene (FEP), pertluoroalkoxy (PFA), thermoplastic poly urethane (TPU), polyethylene terephthalate (PET), sealable polymer tapes, and non-sealable polymer tapes. Thus, the outer electrical insulator 55 defines a radially inner end 55*a* that faces the electrical shield 58, and a radially outer end 55*b* opposite the radially inner end 55*a*. The radially inner end 55*a* can be defined by a radially inner surface that faces the electrical shield 58. The radially outer end 55*b* can be defined by a radially outer surface that is radially opposite the radially inner surface.

The electrical shield 58 can provide electrical shielding, and in particular EMI (electromagnetic interference) shielding to the electrical conductor 52 during operation. In one example, the electrical shield 58 can include a serve shield 60 that includes at least one electrically conductive strand 62 wound about the inner electrical insulator 54 so as to define a plurality of windings 64 that are disposed adjacent each other along the axial direction. The at least one strand 62, and thus the serve shield, can be made of copper, silver, silver plated copper, CuNi Alloys, Cu Alloys, Ag Alloys, Tin, Tin Alloys, or any suitable alternative material or combination thereof. Adjacent ones of the windings 64 can be spaced from each other circumferentially so as to define respective gaps therebetween. It is recognized that, depending on the bend of the electrical cable, some of the adjacent windings 64 can contact each other. The serve shield 60 can also be referred to as an electrically conductive braid 65. The at least one electrically conductive strand 62 can be a metallic strand. For instance, the at least one electrically conductive strand can be made of copper, silver, silver plated copper, CuNi Alloys, Cu Alloys, Ag Alloys, Tin, Tin Alloys or any suitable alternative material or combination thereof.

The serve shield 60, and thus the braid 65, can define a radially inner end 60*a* that faces the inner electrical insulator 54, and a radially outer end 60*b* that is opposite the radially inner end along the radial direction. The radially inner end 60*a* can be partially defined by a radially inner surface that faces the inner electrical insulator 54. The radially outer end 60*b* can be partially defined by a radially outer surface that is radially opposite the radially inner surface. In one example, each winding 64 can define a full revolution about the inner electrical insulator 54, and thus the electrical conductor 54.

For instance, the serve shield 60 can include a plurality of electrically conductive strands 62 that are wound about the inner electrical insulator 54 so as to each define a plurality of windings 64. Adjacent windings 64 can be defined by the same strand 62 or by different strands 62. In one example, the at least one electrically conductive strand 62 can be helically wound about the inner electrical insulator 54. Further, because the inner electrical insulator 54 surrounds the electrical conductor 52, it can be said that the at least one electrically conductive strand is wound about the electrical conductor 52. The windings 64 can combine so as to define a plurality of revolutions about the inner electrical insulator 54, and thus also about the electrical conductor 52. While the windings 64 cane be continuous about their respective helical paths, the serve shield 60 can define interstices 66 between adjacent ones of the windings 64 along the axial direction. The interstices 66 can be defined by the adjacent ones of the windings 64 regardless of whether the windings 64 abut each other circumferentially or are spaced from each other circumferentially.

Figure 1A:
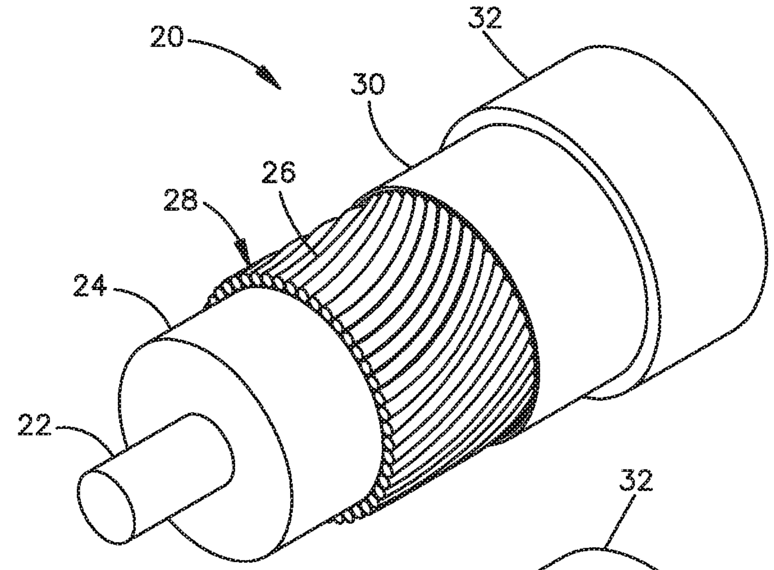
Fig.1A PRIOR ART
FIG. 1A is a perspective view of an electrical cable constructed in accordance with the prior art, with portions removed to illustrate components of the co-axial cable.

In conventional cables, the interstices 66 can be defined at an outer radial end by a shield, such as the electrical shield 58, and at an inner radial end by the inner electrical insulator 54. Further, as described above with respect to FIG. 1A, conventional electrical cables typically include an aluminized mylar tape that surrounds the serve shield along a plane that is oriented perpendicular to the axial direction in order to create an electrically conductive ground path in the axial direction. However, the present inventors have recognized that such electrical cables can suffer from decreased flexibility due to the mylar tape. Further, the addition of mylar tape increases the complexity of the electrical cable.

Further still, mylar tape is subject to crinkling when the electrical cable is bent, which causes portions of the mylar tape to lose contact with the underlying serve shield, thereby potentially compromising the electrical conductivity of the shield along the axial direction. In particular, when the electrical cable is bent, one side of the mylar tape is typically placed in tension, and the opposite side of the mylar tape is typically placed under compression which can produce the crinkling.

Referring now to FIG. 2C in particular, the electrical cable 50 can include an electrically conductive material 68 that can be disposed between the radially outer end 54*b* of the inner electrical insulator 54 and the electrical shield 58. In one example, the electrically conductive material can be applied to one or both of the radially outer surface of the radially outer end 54*b* of the inner electrical insulator 54 and the electrical shield 58. Thus, the electrically conductive material 68 can be disposed in at least one or more of the interstices 66, up to all the interstices 66. Thus, the electrically conductive material 68 can be disposed between the coated onto any suitable structure of the electrical cable 50 such that the electrically conductive material 68 at least partially fills the interstices 66. In particular, the electrically conductive material 68 can define at least one bridge 70 that extends from respective ones of the windings 64 to respective adjacent ones of the windings 64. Thus, the bridge 70 can be said to span across the adjacent ones of the windings. The bridge 70 can span any number of windings 64 as desired up to all of the windings. The bridge 70 can extend along the axial direction or otherwise along a direction that is different than the helical path of the windings 64. Thus, the electrically conductive material 68 can extend along the axial direction so as to be placed in physical contact with each of the windings 64. The electrical shield 58 can therefore be configured as a hybrid shield that includes both the serve shield 60 and the electrically conductive material 68 that defines a continuous electrically conductive path that spans a plurality up to all of the windings 64 along the axial direction. In one example, the hybrid shield can be limited to the serve shield and the electrically conductive material.

Figure 2D:
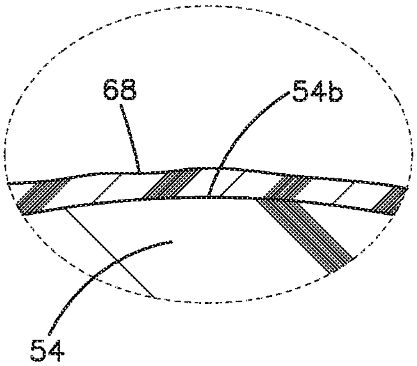
FIG. 2D is an enlarged sectional end elevation view showing a step of fabricating the electrical cable illustrated in FIG. 2A in accordance with one example, including applying electrically conductive material to the inner electrical insulator.

The electrically conductive material 68 can be placed in the interstices 66 in any suitable manner as desired. For instance, in one example, illustrated in FIG. 2D, at least a portion of the electrically conductive material 68 can be applied to the outer radial surface of the inner electrical insulator 54. For instance, the electrically conductive material can be coated onto the radially outer end 54*b* of the inner electrical insulator 54. Thus, as illustrated in FIG. 2F, when the serve shield 60 is wound about the outer radial surface, the electrically conductive material 68 can be positioned in the interstices 66. For example, when the serve shield 60 is wound about the outer radial surface, the at least one strand 62 and the inner electrical insulator 54 can apply a compressive force to the electrically conductive material 68, which causes at least some of the electrically conductive material 68 to become axially displaced and flow into the interstices 66. It should be appreciated that the electrically conductive material 68 can be a flowable material. Thus, the electrically conductive material can define the bridge 70. Further, the electrically conductive material 68 can be confined in a location that extends radially outward from the inner electrical insulator 54 to the radially outer end 60*b* of the serve shield 60.

Figure 2E:
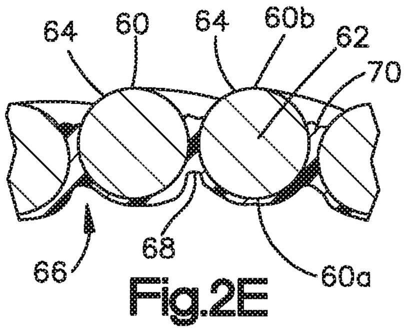
FIG. 2E is an enlarged sectional end elevation view of a step fabricating the electrical cable illustrated in FIG. 2A in accordance with another example, including applying electrically conductive member to an inner surface of the serve shield.
Figure 2F:
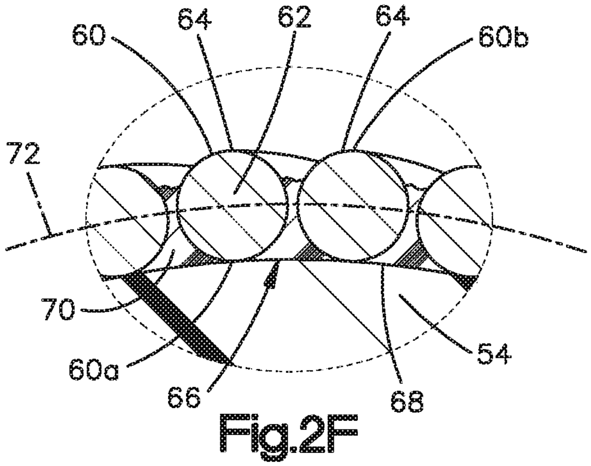
FIG. 2F is an enlarged sectional end elevation view showing the serve shield applied to the inner electrical insulator in accordance with either or both of the steps illustrated in FIGS. 2D and 2E.

Alternatively or additionally, as illustrated in FIG. 2E, at least a portion of the electrically conductive material 68 can be applied to the at least one strand 62 prior to winding the at least one strand 62 about the inner electrical insulator 54. For instance, the electrically conductive material can be coated onto the at least one strand 62. In particular, at least a portion of the electrically conductive material 68 can be applied to the surface or surfaces of the at least one strand 62 that defines the radially inner end 60*a* of the serve shield 60 once applied to the inner electrical insulator 54. Accordingly, as the at least one strand 62 is wound about the inner electrical insulator 54, the compression forces between the at least one strand 62 and the inner electrical insulator 54 can cause some of the electrically conductive material 68 to become displaced and flow into the interstices 66, as illustrated in FIG. 2F, so as to define the bridge 70. Alternatively, at least a portion of the electrically conductive material 68 can be applied to locations on the at least one strand 62 prior to winding the at least one strand 62 about the electrical insulator 54 so as to define the serve shield 60. The locations become axially facing surfaces that are aligned with each other along the axial direction such that the electrically conductive material 68 defines the bridge 70 once the at least one strand 62 is wound about the inner electrical insulator 54 so as to define the serve shield 60. Thus, in one example, the electrically conductive material 68 can be material confined in a location that extends radially from the inner electrical insulator to the radially outer end of the serve shield.

Referring now to FIG. 2F in particular, it is appreciated that the serve shield 60 defines a midline 72 that is radially equidistantly spaced from the radially inner end 60*a* of the serve shield 60 and the radially outer end 60*b* of the serve shield 60. The electrically conductive material 68 can extend radially outward substantially from the radially inner end 60*a* of the serve shield 60 in the interstices 66 toward the midline 72. Thus, at least a portion of the bridge 70 can be defined at a location in the interstices 66 substantially from the radially inner end 60*a* of the serve shield 60 to the midline 72. For instance, the electrically conductive material 68 can extend radially outward substantially from the radially inner end 60*a* of the serve shield 60 in the interstices 66 to the midline 72. Thus, at least a portion of the bridge 70 can be further defined in the interstices 66 at the midline 72. In one example, the electrically conductive material 68 can extend radially outward substantially from the radially inner end 60*a* to a location radially outward of the midline 72. Thus, at least a portion of the bridge 70 can be defined at a location in the interstices 66 substantially from the radially inner end 60*a* of the serve shield 60 to a location radially between the midline 72 and the radially outer end 60*b* of the serve shield 60. Accordingly, in one example, a majority of the electrically conductive material 68 can be confined to a location that extends radially from the inner electrical insulator 54 to the midline 72. The word "substantially" as used in this context recognizes that the electrically conductive material 68 may shrink as it is cured, thereby causing the electrically conductive material 68 to become radially displaced.

Figure 2G:
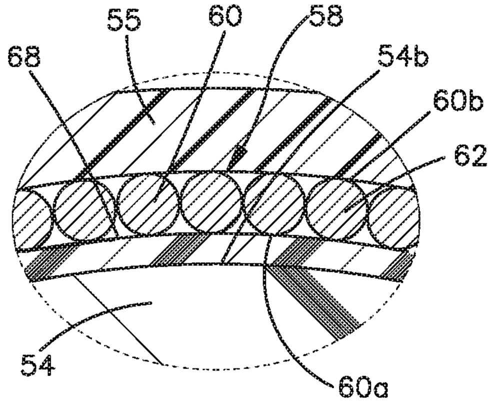
FIG. 2G is an enlarged sectional region similar to FIG. 2C, but constructed in accordance with an alternative embodiment.

In one example referring to FIG. 2G, the electrically conductive material 68 can be disposed radially between the inner electrical insulator 54 and the electrical shield 58. For instance, at least a portion of the electrically conductive material 68 can be confined between the inner electrical insulator 54 and the electrical shield 58. In one example, at least 60% of the electrically conductive material by volume that is disposed between the inner electrical insulator 54 and the electrical shield 58 can be confined between the inner electrical insulator 54 and the electrical shied 58 with respect to the radial direction. For instance, at least 70% of the electrically conductive material by volume that is disposed between the inner electrical insulator 54 and the electrical shield 58 can be confined between the inner electrical insulator 54 and the electrical shied 58 with respect to the radial direction. In one example, at least 80% of the electrically conductive material by volume that is disposed between the inner electrical insulator 54 and the electrical shield 58 can be confined between the inner electrical insulator 54 and the electrical shied 58 with respect to the radial direction. For example, at least 90% of the electrically conductive material by volume that is disposed between the inner electrical insulator 54 and the electrical shield 58 can be confined between the inner electrical insulator 54 and the electrical shied 58 with respect to the radial direction. In one example, an entirety of the electrically conductive material 68 that is disposed between the inner electrical insulator 54 and the electrical shield 58 can be confined between the inner electrical insulator 54 and the electrical shield 58 with respect to the radial direction. In this regard, it should be appreciated that the electrically conductive material 68 can be a solid or non-flowable material. Thus, the electrical shield 58 can be surround the electrically conductive material 68 along a plane that is oriented perpendicular to the axial direction. In one example, the electrically conductive material 68 can coat at least a portion of the radially outer surface of the radially outer end 54*b* of the inner electrical insulator 54. Thus, the electrical shield 58 can be wrapped around the electrically conductive material 68.

In one example, the electrically conductive material 68 can be applied to a substantial entirety of the radially outer surface of the radially outer end 54*b* of the inner electrical insulator 54. Alternatively, the electrically conductive material 68 can be applied to the radially outer surface of the radially outer end 54*b* of the inner electrical insulator 54 in a helical pattern along the radially outer surface. The helical pattern can be aligned with the interstices 66, which are also arranged substantially in a helical pattern. In another example, the electrically conductive material 68 can coat at least the radially inner surface of the at least one strand 62 prior to surrounding the inner electrical insulator 54 with the least one strand 62. The electrically conductive material 68 can be allowed to dry (for instance when the electrically conductive material 68 comprises CNT) prior to winding the serve shield 60 around the electrically conductive material 68.

It should thus be appreciated that the radially outer end of the interstices 66 can be at least partially defined by the serve shield 60 alone or in combination with the at an outer radial end by the electrical shield 58. Where gaps exist between adjacent windings of the serve shield 60, a portion of the radially outer end of the interstices 66 can further be defined by the outer electrical insulator 55 or alternatively by an electrically conductive shield that can surround the serve shield 60. The inner radial end of the interstices 66 can at least partially defined by the electrically conductive material 68. For instance, the inner radial end can be entirely defined by the electrically conductive material 68. Without being bound by theory, the present inventors recognize that the electrical performance of the cable can be improved when at least a portion of the inner radially ends of the interstices 66 are defined by the electrically conductive material 68.

Referring again to FIG. 2C, because the electrical cable 50 does not include aluminized mylar tape that surrounds the serve shield in the prior art, the electrical cable 50 is more flexible than the prior art. Thus, the flexibility of the electrical shield 58 can therefore be greater than the flexibility of a conventional shield that includes a serve shield and aluminized mylar tape. In one example, the electrical shield 58 can be devoid of mylar. Further, in certain examples, the electrical shield 58 can be constructed so as to be devoid of any additional electrically conductive materials disposed radially between the inner electrical insulator 54 and the outer electrical insulator 55 besides the serve shield 60 and the electrically conductive material 68. Further, because the electrically conductive material 68 can be flowable and malleable, the bridge 70 is maintained during bending of the electrical cable 50, thereby providing increased electrical continuity of the electrical shield 58. In this regard, it is recognized that the electrically conductive material 68 can have a flexibility greater than that of mylar tape. Further, the electrically conductive material 68 can have a material stiffness less than that of mylar.

It should be appreciated that the electrically conductive material 68 can define the bridge 70 in any suitable manner as desired. For instance, referring to FIG. 3A, the electrically conductive material 68 can extend in the interstices 66 substantially from the radially outer end 60*b* of the serve shield 60 toward the midline 72 so as to define the bridge 70. For instance, the electrically conductive material. For instance, the electrically conductive material 68 can extend radially inward substantially from the radially outer end 60*b* of the serve shield 60 in the interstices 66 to the midline 72. Thus, at least a portion of the bridge 70 can be further defined in the interstices 66 at the midline 72. In one example, the electrically conductive material 68 can extend radially inward substantially from the radially outer end 60*b* to a location radially outward of the midline 72. Thus, at least a portion of the bridge 70 can be defined at a location in the interstices 66 substantially from the radially inner end 60*a* of the serve shield 60 to a location radially between the midline 72 and the radially outer end 60*b* of the serve shield 60. Thus, the electrically conductive material 68 can be confined in a location that extends radially inward from the outer electrical insulator 55 to the radially inner end 60*a* of the serve shield 60. Further, in one example, a majority of the electrically conductive material 68 can be confined to a location that extends radially from the outer electrical insulator 55 to the midline 72.

Figure 3A:
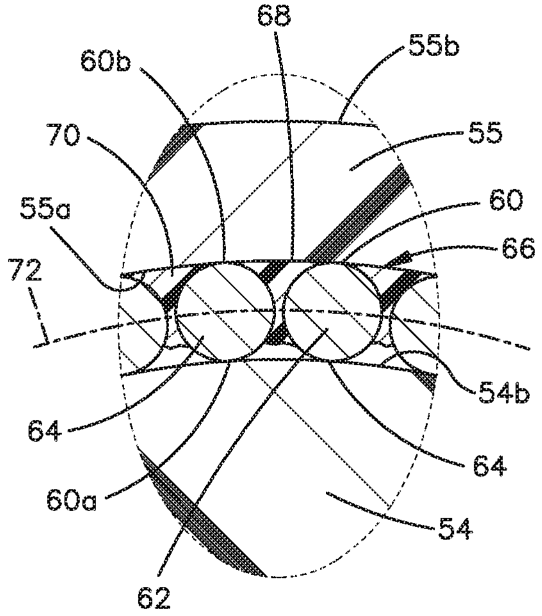
FIG. 3A is an enlarged sectional end elevation view of an electrical cable similar to FIG. 2C, but showing the electrically conductive material applied in accordance with another example.
Figure 3D:
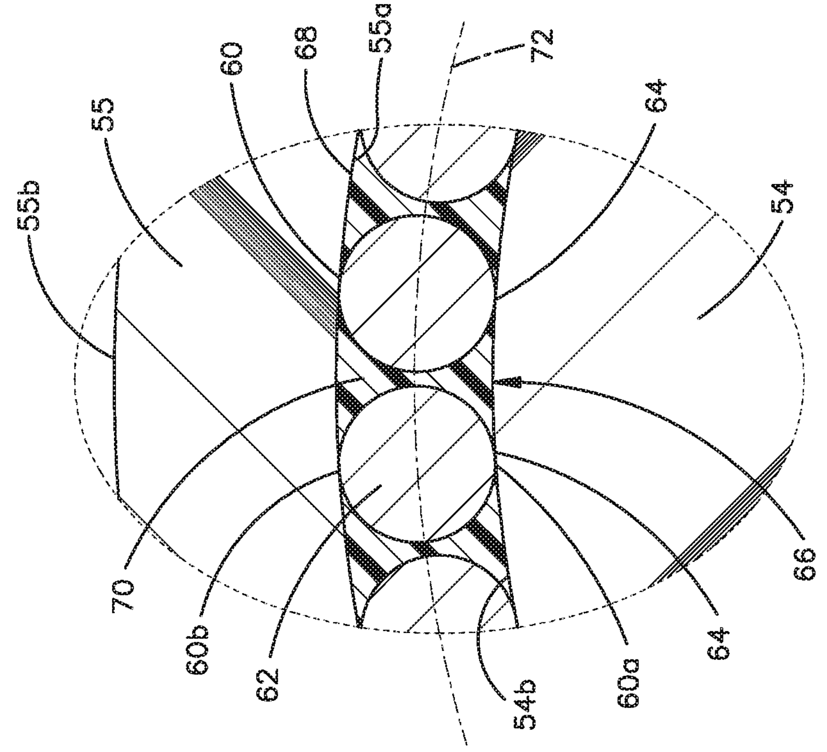
FIG. 3D is an enlarged sectional end elevation view of an electrical cable similar to FIG. 3A, but showing the electrically conductive material applied in accordance with another example.
Figure 3B:
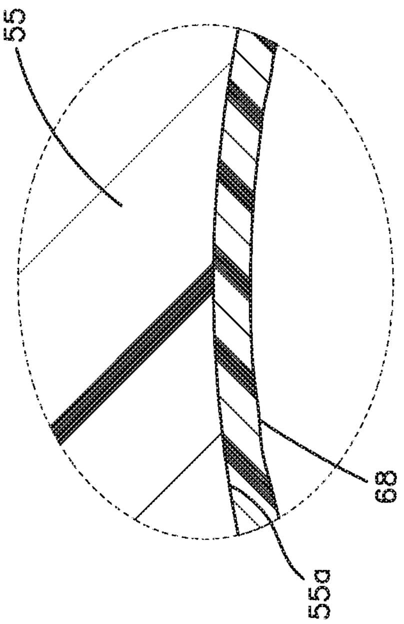
FIG. 3B is an enlarged sectional end elevation view showing a step of fabricating the electrical cable illustrated in FIG. 3A in accordance with one example, including applying electrically conductive material to the outer electrical insulator.

For instance, in one example illustrated in FIG. 3B, at least a portion of the electrically conductive material 68 can be applied to the radially inner end 55*a* of the outer electrical insulator 55. For instance, the electrically conductive material 68 can be coated onto the radially inner end 55*a* of the outer electrical insulator 55. Thus, as illustrated in FIG. 3A, when the outer electrical insulator 55 is applied to the radially outer end 60*b* of the serve shield 60, the electrically conductive material 68 can be positioned in the interstices 66. For example, when the outer electrical insulator 55 is applied to the radially outer end 60*b* of the serve shield 60, the at least one strand 62 and the outer electrical insulator 55 can apply a compressive force to the electrically conductive material 68, which can cause at least some of the electrically conductive material 68 to become axially displaced and flow into the interstices 66 when the electrically conductive material 68 is a flowable material. Thus, the electrically conductive material can define the bridge 70.

Figure 3C:
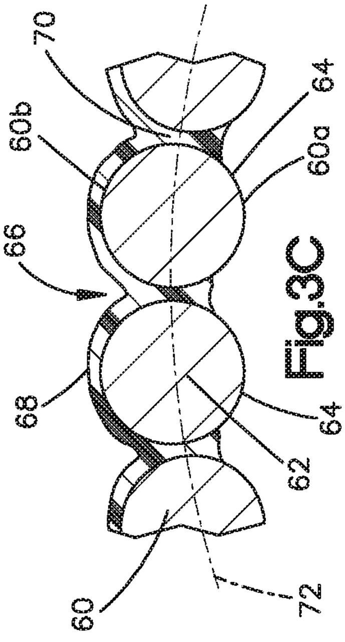
FIG. 3C is an enlarged sectional end elevation view of a step fabricating the electrical cable illustrated in FIG. 3A in accordance with another example, including applying electrically conductive member to an outer surface of the serve shield.

Alternatively or additionally, as illustrated in FIG. 3C, at least a portion of the electrically conductive material 68 can be applied to the at least one strand 62 prior to surrounding the at least one strand 62 with the outer electrical insulator 55. For instance, the electrically conductive material can be coated onto the at least one strand 62. In particular, at least a portion of the electrically conductive material 68 can be applied to the surface or surfaces of the at least one strand 62 that defines the radially outer end 60*b* of the serve shield

60. For instance, at least a portion of the electrically conductive material 68 can be applied to the at least one strand 62 prior to winding the at least one strand about the inner electrical insulator 54. Alternatively, at least a portion of the electrically conductive material 68 can be applied to the at least one strand 62 after the at least one strand 62 has been wound about the inner electrical insulator 54. Accordingly, as the outer electrical insulator 55 is applied to the radially outer end 55*b* of the least one strand 62, the compression forces between the at least one strand 62 and the outer electrical insulator 55 can cause some of the electrically conductive material 68 to become displaced and flow into the interstices 66, as illustrated in FIG. 3A-3F, so as to define the bridge 70. Alternatively, at least a portion of the electrically conductive material 68 can be applied to locations on the at least one strand 62 prior to winding the at least one strand 62 about the electrical insulator 54 so as to define the serve shield 60. The locations become axially aligned with adjacent ones of the windings along the axial direction such that the electrically conductive material 68 defines the bridge 70 once the at least one strand 62 is wound about the inner electrical insulator 54 so as to define the serve shield 60.

Referring now to FIG. 3D, it is recognized that any combination of one or more of, up to all of, the methods described for applying the electrically conductive material 68 can be used to at least partially fill the interstices 66. In one example, at least a portion of the electrically conductive material 68 can be applied to both the radially inner surface of the serve shield 60 and the radially outer surface of the serve shield 60. Alternatively or additionally, at least a portion of the electrically conductive material 68 can be applied to both the inner electrical insulator 54 and the outer electrical insulator 55.

It should be appreciated that any combination of one or more up to all of the methods described herein can cause the electrically conductive material 68 substantially or entirely fill the interstices 66. Alternatively still, in any embodiment described herein, the electrically conductive material 68 can extend radially inward from a first location that is disposed radially between the radially outer end 60*b* of the serve shield 60 and the midline 72 to a second location that is disposed radially between the midline 72 and the radially inner end 60*a*. Thus, the bridge 70 can be defined by the first and second locations. It can therefore bet said that at least a portion of the electrically conductive material 68 is disposed between the radially inner end 60*a* and the radially outer end 60*b* so as to adjoin adjacent ones of the windings of the serve shield 60 along the axial direction. Further still, it should be appreciated that at least a portion of the electrically conductive material 68 can be disposed on one or both of the radially inner surfaces and the radially outer surfaces of adjacent ones of the windings. Further yet, it should be appreciated that at least a portion of the electrically conductive material 68 can be applied to the serve shield 60 into the interstices 66 after the serve shield 60 has been wound about the inner electrical insulator 54 to thereby define the at least one bridge 70. In this regard, it should be appreciated that in some embodiments the electrically conductive material 68 can be a flowable or a nonflowable material.

The electrically conductive material 68 can be configured as any electrically conductive material suitable for use in accordance with any one or more of the methods described herein. In one example, the electrically conductive material 68 can be a solid or non-flowable material. For instance, the electrically conductive material 68 can be solid or non-flowable when applied. Alternatively, the electrically conductive material 68 can be flowable when applied, but solid or non-flowable once cured. For instance, the electrically conductive material 68 can be an electrically conductive epoxy, or polymer, or an electrically conductive ink. The electrically conductive polymer can be extruded, or applied over, as a dielectric serving as first level of electrical shield over the inner electrical insulator 54 as a first layer of electrical shielding. The serve shield 60 can then be applied to about the electrically conductive polymer to increase the effectiveness of the electrical shielding. One example of an electrically conductive polymer includes Clevios™-PEDOT.PSS commercial available by Heraeus Epurio having a principal location in Hanau, Germany. The electrically conductive polymer can have a conductivity up to 1000 Siemens per centimeter (S/cm).

Alternatively, the electrically conductive material 68 can be Umicore Sealing 691 EL, commercially available from Umicore, with corporate headquarters in Brussels, Belgium. Umicore Sealing 691 EL. It has been found that Umicore 691 EL can be particularly advantageous when disposed at an interface between adjacent metallic layers that radially overlap each other, such that the Umicore 691 EL is in mechanical and electrical contact with each of the metallic layers. Umicore 691 EL has an electrical contact resistance of less than 10 milli-ohms (mΩ). Further, Umicore 691 EL is free of chromium. Further, Umicore 691 can maintain reliable electrical conduction between the metallic layers.

Alternatively still, the electrically conductive material 68 can be configured as copper nanotubes (CNT). The CNT can be alternatively fabricated as desired so as to be sufficiently malleable that the CNT when coated onto a surface of the electrical cable maintains its structural integrity as the electrical cable is bent and otherwise manipulated. The CNT can be applied as bath. In still another example, the electrically conductive material can be configured as a plurality of metallic nanoparticles chemically plated onto any surface of an electrical cable as described herein via a suitable binder, such as Thiol. The metallic nanoparticles, can be gold, silver, copper, or any suitable alternative material or combinations thereof. Thus, in one example, the electrically conductive material is not a tape or foil.

In other example, the electrically conductive material 68 can be flowable during operation of the electrical cable. For instance, the electrically conductive material can be flowable after the electrically conductive material has been applied to the electrical cable and cured. Many flowable electrically conductive materials are available. For instance, the flowable electrically conductive material can be configured as an electrically conductive gel. The electrically conductive gel can be defined, for instance, by a liquid metal, such as gallium-indium that is converted to an electrically conductive gel. The electrically conductive gel can provide electrical shielding as it disperses into gaps in the electrical shield to provide an additional layer of electrical conductivity. One example of such an electrically conductive gel is commercially available from Liquid Wire, Inc., having a principal place of business in Beaverton, Oregon. In another example, the flowable electrically conductive material can be configured as a flowable electrically conductive paste. The electrically conductive paste can be applied to an electrically shielded cable during or after the shielding process to disperse into gap areas of the electrical shield, thereby boosting the effectivity of the metal shield. An example of such a conductive paste can be a silver sintering paste commercially available as CT2700 from KYOCERA Corporation having a principal place of business in Kyoto, Japan.

It will therefore be appreciated that the electrically conductive material 68 can be applied to at least one or more surfaces as desired as a coating. Thus, the electrically conductive material 68 can be referred to herein as an electrically conductive coating. The coating can be flexible to allow for bending of the electrical cable. As described above, the at least one or more surface can be configured as one or more up to all of the inner electrical insulator 54, the at least one strand 62 (prior to or after forming the serve shield 60), and the outer electrical insulator 55. For instance, the electrically conductive material 68 can be applied as a coating. In one example, the electrically conductive material 68 can be sprayed onto the surface. Alternatively or additionally, the electrically conductive material 68 can be brushed onto the surface. Alternatively or additionally still, the electrically conductive material 68 can be provided as a liquid bath, and the surface can be submerged in the liquid bath. In still other examples, the electrically conductive material 68 can be chemical vapor deposited (CVD) onto the surface. Alternatively or additionally, the electrically conductive material 68 can be plasma-applied to the surface. Alternatively or additionally still, the electrically conductive material 68 can be electroplated onto the surface. Alternatively or additionally still, the electrically conductive material 68 can be dispersion-coated onto the surface.

In certain embodiments, when the electrically conductive material 68 is applied to the surface as a liquid, the electrically conductive material 68 can be cured so as to increase the viscosity of the electrically conductive material 68. For instance, the electrically conductive material 68 can be subjected to infrared light. Alternatively or additionally, the electrically conductive material 68 can be subjected to ultraviolet light. The electrically conductive material 68 can be flowable in the manner described herein after it is cured.

Referring now to FIGS. 2A-3D in general, it will be readily appreciated that methods can be provided for fabricating the electrical cable 50 having the electrical shield 58 that includes the serve shield 60 in combination with the electrically conductive material 68. The method can include the steps of surrounding the at least one electrical conductor 52 with the inner electrical insulator 54. When the at least one electrical conductor 52 includes first and second electrical conductors, the surrounding step can include surrounding the first and second electrical conductors with the inner electrical insulator 54.

Next, the method can include the step of wrapping the at least one electrically conductive strand 62 about the inner electrical insulator 54 so as to define a plurality of windings that, in turn, define the serve shield 60. For instance, the wrapping step can include wrapping a plurality of electrically conductive strands 62 that are disposed adjacent each other along the axial direction about the inner electrical insulator 54. For instance, the wrapping step can include wrapping the at least one electrically conductive strand 62 along a helical path about the inner electrical insulator 54.

The method can further include, before or after the wrapping step, the step of causing at least some of an electrically conductive material 68 to be disposed in the interstices 66 that are defined between adjacent ones of the windings, such that the electrical shield 58 defines a hybrid electrical shield that includes the at least one electrically conductive strand 62 and the at least some of the electrically conductive material 68. The hybrid shield can define an electrically conductive path defined along the axial direction by the windings and the electrically conductive material 68. In one example, the causing step can include the step of applying the electrically conductive material 68 to the radially inner end of the at least one strand 62 that faces the electrical insulator 54 when the at least one strand is wrapped about the inner electrical insulator 54 so as to define the serve shield 60. Alternatively or additionally, the causing step can include the step of applying the electrically conductive material 68 to a radially outer end of the at least one strand 62 that faces away from the inner electrical insulator 54 when the at least one strand 62 is wrapped about the inner electrical insulator 54 to define the serve shield. Alternatively or additionally, the causing step can include the step of applying the electrically conductive material 68 to one or more surfaces of the strand 62 that are axially facing and axially aligned with each other when the at least one strand 62 is wrapped about the inner electrical insulator 54 so as to define the serve shield 60.

Thus, in one example, causing step can include the step of applying at least a portion of the electrical material 68 directly to the at least one strand 62 either 1) in the interstices 66 after the at least one strand 62 has been wrapped about the inner electrical insulator 54 so as to define the serve shield 60, or 2) to one or more locations that are designated to at least partially define the interstices 66 after the at least one strand 62 is wrapped about the electrical insulator 54. Alternatively or additionally, the causing step can include the step of causing at least a portion of the electrically conductive material 68 to flow into interstices 66 so as to establish the electrically conductive path. At least a portion of the electrically conductive material 68 can be caused to flow into the interstices 66 when the at least one strand 62 is wrapped about the inner electrical insulator 54. Alternatively or additionally, at least a portion of the electrically conductive material 68 can be caused to flow into select ones of the interstices 66 when the electrical cable 50 is bent.

While the electrically conductive material 68 has been described in combination with the electrical cable 50 including the serve shield 60 as illustrated in FIGS. 2A-3D, it should be appreciated that the electrical cable 50 can include any suitable alternatively constructed shield as desired. For instance, as recited in FIGS. 4A-4D, the electrical shield 58 can be alternatively constructed. In particular, the electrical shield 58 can include at least one electrically conductive material that surrounds the inner electrical insulator 54 in place of including the serve shield 60 described above with respect to FIGS. 2A-3D. The electrically conductive material can be configured as at least one wrapping 74 that surrounds the inner electrical insulator 54.

Figure 1B:
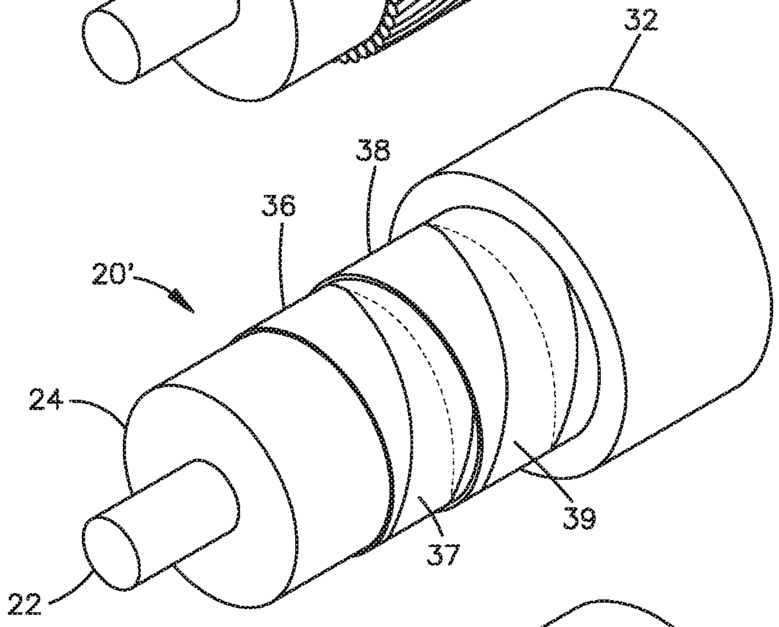
Fig.1B PRIOR ART
FIG. 1B is a perspective view of another electrical cable constructed in accordance with the prior art.

The present inventors recognize that the electrically conductive shields and tape shields of conventional electrical cables, such as those illustrated in FIG. 1B, can tend to crinkle when the electrical cable is bent. In particular, when the electrical cable is bent, one side of the wrapping, which can be an electrical foil shield or an electrical tape shield, is typically placed in tension, and the opposite side is typically placed under compression, which can produce the crinkling. For instance, depending on how the cable is bent, one or more portions of the wrapping can deflect radially outward away from the inner electrical insulator, and another one or more portions of the wrapping an deflect radially inward away from the outer electrical insulator. When this occurs, discontinuities in the electrical path as defined by the wrapping or tape shield can be created along the axial direction. Further, overlapped regions of the wrapping or tape shield can slide and wipe along each other when the electrical cable is bent. Repeated wiping can cause the metal of the wrapping or tape to oxidize, which can further create discontinuities in the electrical path.

Accordingly, as will now be described with reference to FIGS. 4A-6H, the electrically conductive material 68 can be applied to at least a portion of the electrical cable 50. For instance, the at least a portion of the electrical cable 50 can include the at least one electrically conductive wrapping 74 instead of the serve shield 60 described above with reference to FIGS. 2A-3F. It can be advantageous for the electrically conductive material 68 to provide a low friction interface. Alternatively or additionally, it can be advantageous for the electrically conductive material to provide an anti-oxidation layer to the layer that is coated by the electrically conductive material. Alternatively or additionally still, it can be advantageous for the electrically conductive material to provide a barrier to galvanic effect of the layer that is coated by the electrically conductive material. In this regard, the electrically conductive material 68 can be an electrically conductive flowable material of the type described above. Alternatively, the electrically conductive material 68 can be an electrically conductive non-flowable material of the type described above.

In one example, as described above, the electrically conductive material can define a Umicore Sealing 691 EL material at interfaces between radially adjacent metallic layers that radially overlap each other, such that the Umicore 691 EL can coat at least one or more up to each of the metallic layers. Thus, the Umicore 691 EL can be in mechanical and electrical contact with each of the metallic layers that it coats. The Umicore Sealing 691 EL can be a coating that exhibits low friction. For instance, Umicore Sealing 691 EL can have a coefficient of friction that is less than the coefficient of friction of a silver-on-silver interface. For instance, the coefficient friction of Umicore sealing 691 EL that is less than half the coefficient of friction of the silver-on-silver interface. In one example, the coefficient friction of Umicore sealing 691 EL can be approximately 10% the coefficient of friction of a silver-on-silver interface. Further, the Umicore sealing 691 EL can define a barrier to galvanic effect of whatever metal it coats. Further still, the Umicore Sealing 691 EL and an anti-oxidation agent that helps prevent oxidation of one or both of the adjacent layers. The at least one electrically conductive wrapping 74 can be in the form of an electrically conductive foil. For instance, the foil can be a copper foil, or any be any suitable alternative material as desired. Alternatively, the at least one electrically conductive wrapping 74 can be in the form of an electrically conductive tape. For instance, the tape can be an aluminized mylar tape or any suitable alternative tape as desired. Thus, the electrical shield 58 can include at least one electrically conductive wrapping 74. The at least one electrically conductive wrapping 74 can surrounds the inner electrical insulator 54, and provide electrical shielding to the at least one electrical conductor 52. As will be appreciated from the description below, the electrically conductive material 68 can be applied to the at least one electrically conductive wrapping 74 in any suitable manner as desired.

Figure 4A:
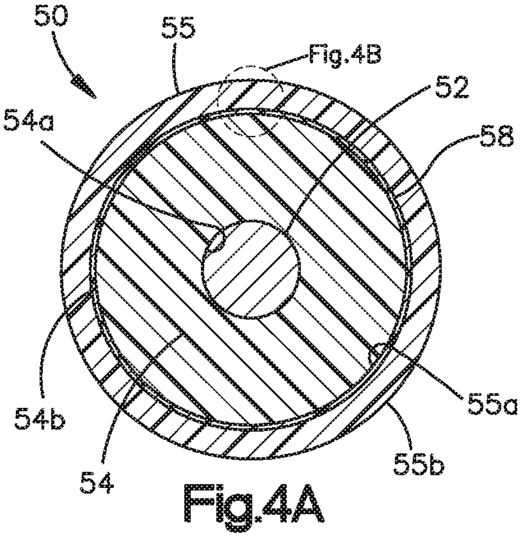
FIG. 4A is an enlarged sectional end elevation view of a region of an electrical cable constructed in accordance with another embodiment, including an electrically conductive wrapping.
Figure 4B:
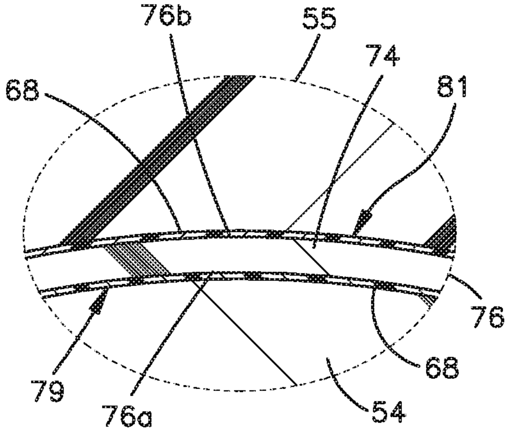
FIG. 4B is an enlarged sectional end elevation view of a portion of the electrical cable illustrated in FIG. 4A, taken along line 4B.
Figure 4C:
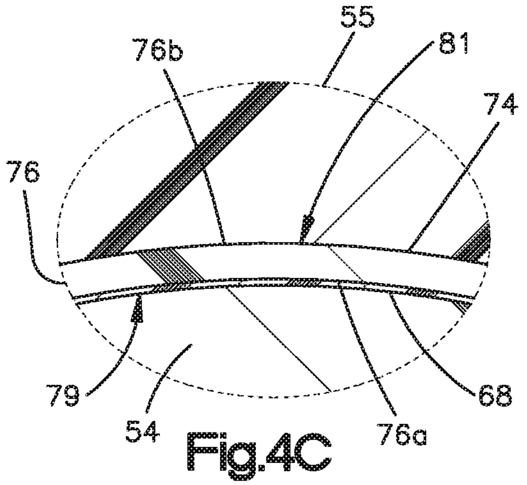
FIG. 4C is an enlarged sectional end elevation view of the portion of an electrical cable similar to the electrical cable illustrated in FIG. 4B, but constructed in accordance with another embodiment.
Figure 4D:
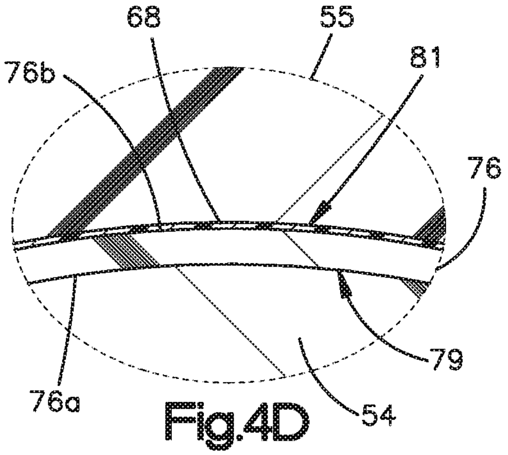
FIG. 4D is an enlarged sectional end elevation view of the portion of an electrical cable similar to the electrical cable illustrated in FIG. 4B, but constructed in accordance with still another embodiment.
Figure 4E:
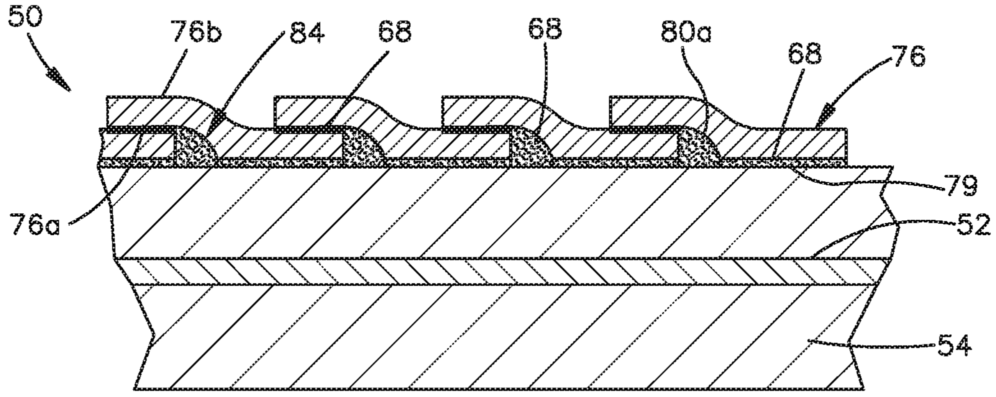
FIG. 4E is an enlarged sectional end elevation view of the portion of an electrical cable similar to the electrical cable illustrated in FIG. 4B, but constructed in accordance with another embodiment.
Figure 5:
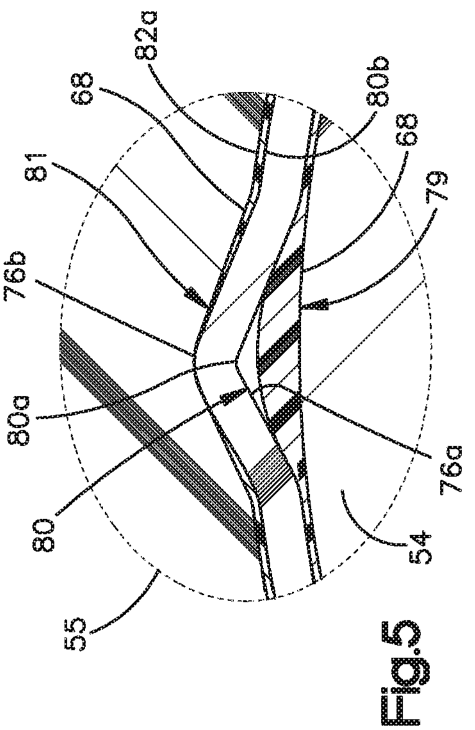
FIG. 5 is an enlarged sectional end elevation view of the region of the electrical cable illustrated in FIG. 4A, showing a wrapping deflected radially so as to define gaps that are at least partially filled with electrically conductive material.

Referring now to FIGS. 4A-5, the at least one electrically conductive wrapping 74 can include a first or inner electrically conductive wrapping 76. In one example, the first or inner electrically conductive wrapping 76 can be the only wrapping that is disposed radially between the inner electrical insulator 54 and the outer electrical insulator 55. In other examples, the at least one electrically conductive wrapping 74 can define a second or outer electrically conductive wrapping 78 (see FIGS. 6A-6C and 7A-7B) can radially surround the first wrapping 76. For instance, the second electrically conductive wrapping 78 can be disposed radially between the first wrapping 76 and the outer electrical insulator 55.

The first wrapping 76 can be form of an electrically conductive foil. For instance, the foil can be a copper foil, or any be any suitable alternative material as desired. The first wrapping 76 can be in the form of an electrically conductive tape. For instance, the tape can be an aluminized mylar tape or any suitable alternative tape as desired. The first electrically conductive wrapping 76 defines a first radially inner end 76*a* that faces the inner electrical insulator 54, and a first radially outer end 76*b* that is opposite the radially inner end 76*a*. The radially inner end 76*a* can be defined by a radially inner surface that faces the electrical insulator 54. The radially outer end 76*b* can be defined by a radially outer surface that is opposite the radially inner surface. In one example, the first electrically conductive wrapping 76 can be wrapped about the inner electrical insulator 54. The first electrically conductive wrapping 76 can be an electrically conductive metal. For instance, the first electrically conductive wrapping 76 can be made of copper, silver, silver plated copper, CuNi Alloys, Cu Alloys, Ag Alloys, Tin, Tin Alloys, aluminum or any suitable alternative material or combination thereof. Thus, the first electrically conductive wrapping 76 can provide electrical shielding to the at least one electrical conductor 52.

For instance, the first electrically conductive wrapping 76 can overlap itself as it is wound about the inner electrical insulator 54 so as to define a first overlapped region (see, e.g. overlapped region 77 at FIG. 4E). The first overlapped region can be defined by first and second portions of the wrapping 76 that overlap each other and are aligned with each other along the radial direction. For instance, the radially outer surface of the first wrapping 76 at the first portion can face the radially inner surface of the first wrapping 76 at the second portion. In one example, the first wrapping 76 can be helically wrapped about the inner electrical insulator 54. Thus, the first overlapped region 77 can be a helical overlapped region. Further, the first overlapped region can define a plurality of revolutions about the inner electrical insulator 54, and thus about the central axis of the at least one electrical conductor 52.

In one example, the electrically conductive material 68 can be disposed between the radially outer end 76*b* of the first wrapping 76 at the first portion and the radially inner end 76*a* of the first wrapping at the second portion in the first overlapped region. As a result, the electrically conductive material 68 can prevent oxidation of the respective surfaces of the first and second portions of the first wrapping 76 that face each other. As described above, Umicore Sealing 691 EL can be particularly advantageous as the electrically conductive material 68 when disposed at interfaces between radially adjacent metallic layers that radially overlap each other, such that the Umicore 691 EL is in mechanical and electrical contact with each of the metallic layers. In one example, the adjacent metallic layers can be defined by the first and second portions of the first wrapping 76. The Umicore 691 EL or other electrically conductive material can be applied to one or both of the radially outer end at the first portion and the radially inner end at the second portion.

Because the electrically conductive material 68 is disposed in an interface between the respective surfaces of the first and second portions of the first wrapping 76 that face each other, the electrically conductive material 68 can prevent oxidation of the respective surfaces of the first and second portions of the first wrapping 76 that face each other when they slide along each other during operation as the electrical cable 50 is bent. The electrically conductive material 68 can be disposed in a portion up to a substantial entirety of the first overlapped region. In one example, the electrically conductive material 68 can be confined to the first overlapped region. Alternatively or additionally, the electrically conductive material 68 can be disposed in one or more other locations in addition to the first overlapped region. In this regard, the electrically conductive material 68 can be applied to one or more surfaces of the first wrapping 76 that are predetermined to define the overlapped region once the first wrapping 76 is subsequently wrapped about the inner electrical insulator 54.

Further, as illustrated in FIG. 4E, the electrical cable can define first radially inner gaps 80*a* that extends radially between the first wrapping 76 and the inner electrical insulator 54. In one example, as the second portion of the first wrapping 76 extends axially out from the first portion of the first wrapping 76, the first radially inner gaps 80*a* can be defined between the first radially inner end 76*a* of the second portion of the first wrapping 76 and the radially outer end 54*b* of the inner electrical insulator 54.

Further, referring now to FIG. 5, and as described above, wrappings of electrical cables can tend to crinkle when the electrical cable is bent, such that the first wrapping 76 can partially define first gaps 80. For instance, when the electrical cable 50 is bent, the first gaps 80 can include radially inner gaps 80*a* that can extend from the radially inner end 76*a* of the first wrapping 76 and the radially outer end 54*b* of the inner electrical insulator 54. At least one or more of the first gaps 80 can be first radially inner gaps 80*a* of the first wrapping 76. In particular, at least one or more of the first radially inner gaps 80*a* can be defined by the radially inner surface of the first wrapping 76 and the radially outer end of the inner electrical insulator 54. Thus, the first radially inner gaps 80*a* can be defined in a radially inner interface 79 between the radially inner end 76*a* of the first wrapping 76 and the inner electrical insulator 54. In particular, the radially inner interface 79 can define a radial thickness at the radially inner gaps 80*a* that is greater than the radial thickness of the radially inner interface 79 at locations circumferentially spaced from the gaps 80.

Alternatively or additionally, at least one or more of the first gaps 80 can be first radially outer gaps 80*b* of the first wrapping 76. In particular, at least one or more of the first radially outer gaps 80*b* can be defined by the radially outer surface of the first wrapping 76 and the radially inner end of the outer electrical insulator 55. The first radially outer gaps 80*b* can be defined by a radially outer interface 81 between the radially outer end 76*b* of the first wrapping 76 and the outer electrical insulator 55. Alternatively, as described in more detail below, the first radially outer gaps 80*b* can be defined by a radially outer interface 81 between the radially outer end 76*b* of the first wrapping 76 and a second or outer electrically conductive wrapping.

In particular, the radially outer interface 81 can define a radial thickness at the first radially outer gaps 80*b* that is greater than the radial thickness of the radially outer interface 81 at locations circumferentially spaced from the first gaps 80. It should be appreciated that the term "circumferential" and derivatives thereof apply to cables having a single cable and first and second electrical conductors, even though cables having first and second electrical conductors may not define a circle in cross-section.

The electrical cable 50 can include the electrically conductive material 68 that can be configured to occupy at least one of the first gaps 80 up to a plurality of the first gaps 80 or all of the first gaps 80. In one example, the electrically conductive material 68 can at least partially define the radially inner end of the first gaps 80 as described above with respect to the interstices 66. Alternatively or additionally, the electrically conductive material 68 can flow into the first gaps 80 when the electrical cable 50 is bent. Alternatively or additionally, a portion of the electrically conductive material 68 can be applied to, and thus predisposed on, one or more locations of the inner electrical insulator 54 that at least partially defines respective ones of the gaps 80 when the electrical cable 50 is bent. Alternatively or additionally still, a portion of the electrically conductive material 68 can be applied to, and thus predisposed on, one or more locations of the first wrapping 76 that at least partially define respective ones of the gaps 80 when the electrical cable 50 is bent.

Depending on where the electrically conductive material 68 is applied, the electrically conductive material 68 can be disposed in one or more of the gaps 80 when the gaps 80 are created without flowing into the gaps 80. Alternatively or additionally, the electrically conductive material 68 can flow into one or more others of the gaps 80. Further, in examples whereby the electrically conductive material 68 coats at least a portion of the first wrapping 76, or any of the wrappings described herein, the electrically conductive material 68 can resist the formation of gaps 80. That is, for a given bend of the electrical cable 50, the first wrapping 76 can produces more gaps 80 when the first wrapping 76 is not coated with the electrically conductive material as compared to when the first wrapping 76 is coated with the electrically conductive material.

As illustrated in FIG. 4B, the electrically conductive material 68 can be disposed in the radially inner interface 79 between the radially inner end 76*a* of the first wrapping 76 and the inner electrical insulator 54. The radially inner interface 79 can be defined by the radially inner end 76*a* first wrapping 76 and the inner electrical insulator 54. For instance, the electrically conductive material 68 can be applied to the radially outer end of the inner electrical insulator 54 so as to be disposed in at least a portion of the radially inner interface 79. Alternatively or additionally, the electrically conductive material 68 can be applied to the radially inner surface of the first wrapping 76 so as to be disposed in at least a portion of the radially inner interface 79. In this regard, it should be appreciated that the electrically conductive material 68 can be applied to a surface of the first wrapping 76 that is predetermined to define the radially inner surface of the first wrapping 76 once the first wrapping 76 is subsequently wrapped about the inner electrical insulator 54. The electrically conductive material can be applied to at least a portion of the radially inner surface of the first wrapping 76 up to a substantial entirety of the radially inner surface of the first wrapping 76.

Alternatively or additionally, the electrically conductive material 68 can be disposed at the radially outer interface 81 between the radially outer end 76*b* of the first wrapping 76 and the outer electrical insulator 55. The radially outer interface 81 can be defined by the radially outer end 76*b* first wrapping 76 and the outer electrical insulator 55. For instance, the electrically conductive material 68 can be applied to the radially inner surface of the outer electrical insulator 55 so as to be disposed in at least a portion of the radially outer interface 81. Alternatively or additionally, the electrically conductive material 68 can be applied to the radially outer surface of the first wrapping 76 so as to be disposed in at least a portion of the radially outer interface 81. In this regard, it should be appreciated that the electrically conductive material 68 can be applied to the radially outer surface of the first wrapping 76 after the first wrapping 76 has been wrapped about the inner electrical insulator 54. Alternatively or additionally, the electrically conductive material 68 can be applied to a surface of the first wrapping 76 that is predetermined to define the radially outer surface of the first wrapping 76 once the first wrapping 76 is subsequently wrapped about the inner electrical insulator 54. The electrically conductive material 68 can be applied to at least a portion of the radially outer surface of the first wrapping 76 up to a substantial entirety of the radially outer surface of the first wrapping 76.

It should thus be appreciated that electrically conductive material 68 disposed in the radially inner interface 79 can flow into the respective radially inner gaps 80*a* when the electrical cable 50 is bent. Alternatively or additionally, the electrically conductive material 68 can be predisposed in the radially inner interface 79 at a location that defines one of the radially inner gaps 80*a* when the electrical cable 50 is bent. Similarly, electrically conductive material 68 disposed in the radially outer interface 81 can flow into the respective first radially outer gaps 80*b* when the electrical cable 50 is bent. Alternatively or additionally, the electrically conductive material 68 can be predisposed in the radially outer interface 81 at a location that defines one of the radially inner gaps 80*a* when the electrical cable 50 is bent.

In another example illustrated in FIG. 4C, the electrically conductive material 68 can be confined to the radially inner interface 79 between the first wrapping 76 and the inner electrical insulator 54. Thus, the electrical cable 50 can be devoid of electrically conductive material 68 at the radially outer interface 81 between the first wrapping 76 and the outer electrical insulator 55. Alternatively, in still another example illustrated in FIG. 4D, the electrically conductive material 68 can be confined to the radially outer interface 81 between the first wrapping 76 and the outer electrical insulator 55. Thus, the electrical cable 50 can be devoid of electrically conductive material 68 at the radially inner interface 79 between the first wrapping 76 and the inner electrical insulator 54.

As illustrated in FIGS. 4A-4D, the electrical cable 50 can include no wrappings other than the first wrapping 76. Thus, in one example, the electrical cable 50 can include no wrappings that are disposed radially between the first wrapping 76 and the outer electrical insulator 55.

In one example referring to FIG. 4E, it is recognized that the first electrically conductive wrapping 76, and all wrappings described herein unless otherwise indicated, can overlap itself as it is wound so as to define an overlapped region. For instance, the first electrically conductive wrapping 76 overlaps itself as it is wound about the inner electrical insulator 54 so as to define the first overlapped region 77. The first electrically conductive wrapping 76 thus defines at least one radial gap, such as at least one first radial gap 84, disposed between the first wrapping 76 and the inner electrical insulator 54 along the radial direction. It should be appreciated that the first radially inner gaps 80*a* can thus be defined when the electrical cable is bent as described above. Alternatively or additionally, the first radially inner gaps 80*a* can be defined by the first radial gap 84.

Thus, in one example, the electrically conductive material 68 can be disposed at the first interface 79 between the inner electrical insulator 54 and the radially inner end 76*a* of the first wrapping 76 at least at the first radial gap 84. For instance, at least a portion of the electrically conductive material 68 can be confined between the inner electrical insulator 54 and the first wrapping 76. In one example, at least 60% of the electrically conductive material by volume that is disposed between the inner electrical insulator 54 and the first wrapping 76 can be confined between the inner electrical insulator 54 and the electrical shied 58 with respect to the radial direction. For instance, at least 70% of the electrically conductive material by volume that is disposed between the inner electrical insulator 54 and the first wrapping 76 can be confined between the inner electrical insulator 54 and the electrical shied 58 with respect to the radial direction. In one example, at least 80% of the electrically conductive material by volume that is disposed between the inner electrical insulator 54 and the first wrapping 76 can be confined between the inner electrical insulator 54 and the electrical shied 58 with respect to the radial direction. For example, at least 90% of the electrically conductive material by volume that is disposed between the inner electrical insulator 54 and the first wrapping 76 can be confined between the inner electrical insulator 54 and the electrical shied 58 with respect to the radial direction. In one example, an entirety of the electrically conductive material 68 that is disposed between the inner electrical insulator 54 and the first wrapping 76 can be confined between the inner electrical insulator 54 and the electrical shield 58 with respect to the radial direction.

In this regard, it should be appreciated that the electrically conductive material 68 can be a solid or non-flowable material after curing. Thus, the first wrapping 76 can be surround the electrically conductive material 68. In one example, the electrically conductive material 68 can coat the radially outer surface of the radially outer end 54*b* of the inner electrical insulator 54. Thus, the first wrapping 76 can be wound around the electrically conductive material 68. In this regard, it should be appreciated that the electrically conductive material 68 can be a solid or non-flowable material. Thus, the first wrapping 76 can be surround the electrically conductive material 68. In one example, the electrically conductive material 68 can coat the radially outer surface of the radially outer end 54*b* of the inner electrical insulator 54. Thus, the first wrapping 76 can be wound around the electrically conductive material 68. The electrically conductive material 68 can be allowed to dry (for instance when the electrically conductive material 68 comprises CNT) prior to winding the first wrapping 76 around the electrically conductive material 68.

In one example, the electrically conductive material 68 can be applied to a substantial entirety of the radially outer surface of the radially outer end 54*b* of the inner electrical insulator 54. Alternatively, the electrically conductive material 68 can be applied to the radially outer surface of the radially outer end 54*b* of the inner electrical insulator 54 in a helical pattern along the radially outer surface. The helical pattern can be aligned with the gap 84, which can also extend substantially in a helical pattern. In another example, the electrically conductive material 68 can coat at least a portion of the radially inner surface of the first wrapping 76 prior to surrounding the inner electrical insulator 54 with the least one strand 62.

It should thus be appreciated that the radially outer end of the first radial gap 84 can be defined by the first wrapping 76, and the inner radial end of the first radial gap 84 can at least partially defined by the electrically conductive material 68. For instance, the inner radial end can be entirely defined by the electrically conductive material 68. Without being bound by theory, the present inventors recognize that the electrical performance of the cable can be improved when at least a portion of the inner radially end of the first radial gap 84 is defined by the electrically conductive material 68.

Figure 6A:
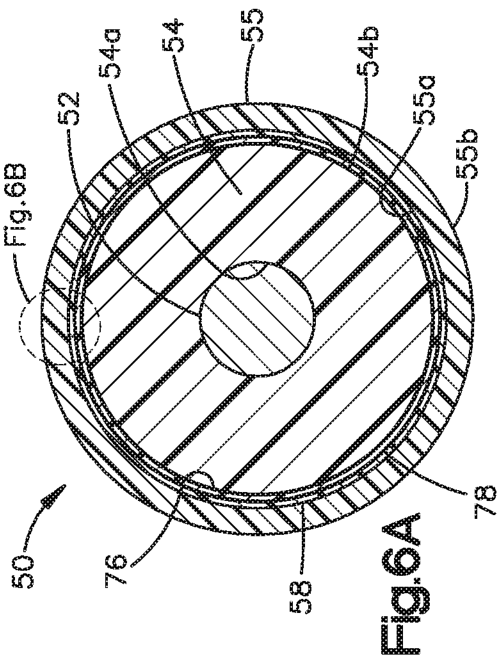
FIG. 6A is a sectional end elevation view of an electrical cable constructed in accordance with an alternative embodiment, having an electrical shield that includes first and second electrically conductive wrappings.
Figure 6C:
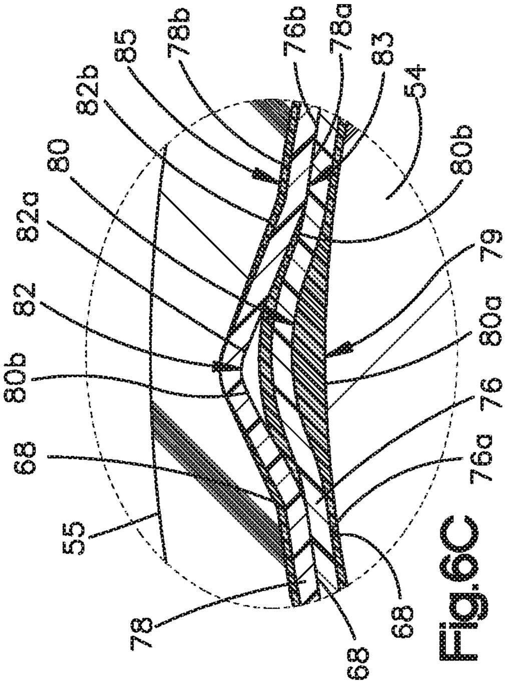
FIG. 6C is an enlarged sectional end elevation view of the region of the electrical cable illustrated in FIG. 6B, showing the first and second wrappings deflected radially so as to define gaps that are at least partially filled with electrically conductive material.
Figure 6B:
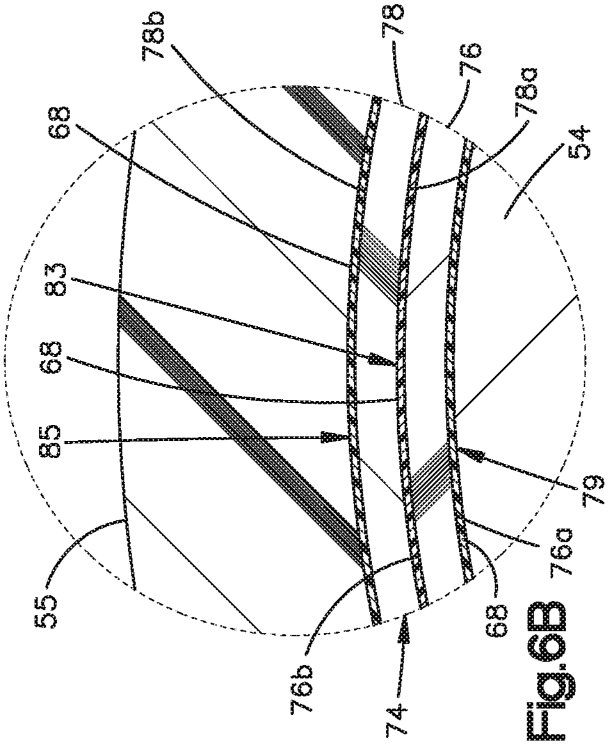
FIG. 6B is an enlarged sectional end elevation view of the region of the electrical cable illustrated in 6A, taken at line 6B, showing an electrically conductive material disposed at radially inner and outer surfaces of each of the first and second wrapping.

Alternatively, referring now to FIGS. 6A-6C, the at least one electrically conductive wrapping 74 of the electrical cable 50 can include the first wrapping 76 that surrounds the inner electrical insulator 54 as described above. Further, the at least one electrically conductive wrapping 74 can include a second or outer electrically conductive wrapping 78 that surrounds the first wrapping 76. Thus, the first wrapping 76 can be referred to as an inner wrapping, and the second wrapping 78 can be referred to as an outer wrapping that is disposed radially outward of the inner wrapping. It should be appreciated that the at least one electrical shield 58 can include any suitable electrically conductive layer that surrounds the first electrically conductive wrapping 76. The electrically conductive layer can for instance be configured as a braid or foil. In one example, the electrically conductive layer can be disposed between the first electrically conductive wrapping 76 and the outer electrical insulator 55. As described above, Umicore Sealing 691 EL can be particularly advantageous as the electrically conductive material 68 when disposed at interfaces between radially adjacent metallic layers that radially overlap each other, such that the Umicore 691 EL is in mechanical and electrical contact with each of the metallic layers. The first wrapping 76 and the electrically conductive layer can define the radially adjacent metallic layers in some examples. The Umicore 691 EL or other suitable electrically conductive material can be applied to at least one or both of the radially outer end of the first wrapping 76 and the radially inner end of the metallic layer.

In one example, the electrically conductive material can be configured as the second electrically conductive wrapping 78 that defines a second radially inner end 78*a* that faces the first wrapping 76, and in particular faces the first radially outer end 76*b* of the first wrapping 76. The second radially inner end 78*a* can be defined by a second radially inner surface that faces the inner electrical insulator 54. The second wrapping 78 further defines a second radially outer end 78*b* that is opposite the second radially inner end 78*a*. The second radially outer end 78*b* can be defined by a second radially outer surface that is opposite the second radially inner surface. The second radially outer end 78*b* can face the outer electrical insulator 55. The second electrically conductive wrapping 78 can be an electrically conductive metal. For instance, the second electrically conductive wrapping 78 can be made of copper, silver, silver plated copper, CuNi Alloys, Cu Alloys, Ag Alloys, Tin, Tin Alloys, aluminum, or any suitable alternative material or combination thereof. In this regard, the second electrically conductive wrapping 78 can be made of the same material as the first wrapping 76. Alternatively, the second electrically conductive wrapping can be made of or a different material than the first wrapping 76.

Thus, the first and second wrappings 76 and 78 can combine so as to define an electrical shield for the at least one electrical conductor 52. The electrical cable can be configured as a coaxial cable having only the single electrically conductor 52. Alternatively, as discussed above, the electrical cable 50 can be configured as a twinaxial cable whereby the at least one electrical conductor 52 includes the coextruded first and second electrical conductors 52*a* and 52*b* (see FIGS. 7A-7B). As will be appreciated from the description below, the electrically conductive material 68 can be disposed at any one or more up to all of the 1) the radially inner interface 79 between the inner electrical insulator 54 and the first wrapping 76, 2) an intermediate interface 83 between the first wrapping 76 and the second wrapping 78, and 3) a radially outer interface 85 between the second wrapping 78 and the outer electrical insulator 55.

The second electrically conductive wrapping 78 can overlap itself as it is wound about the first wrapping 76 so as to define a second overlapped region. The second overlapped region can be defined by portions of the second wrapping 78 that overlap each other and are aligned with each other along the radial direction. For instance, the radially outer surface of the second wrapping 78 at the first portion can face the radially inner surface of the second wrapping 78 at the second portion. For instance, the radially inner surface can face the radially outer surface 78*b* at the second overlapped region. In one example, the second wrapping 78 can be helically wrapped about the first wrapping 76. Thus, the second overlapped region can be a helical overlapped region. Further, the second overlapped region can define a plurality of revolutions about the first wrapping 76, and thus about the central axis of the at least one electrical conductor 52, such as the first and second electrical conductors 52*a* and 52*b* (see FIG. 7A).

In one example, the electrically conductive material 68 can be disposed between the radially outer end 78*b* of the second wrapping 78 and the radially inner end 78*a* of the respective portions of the second wrapping 78 in the second overlapped region. As a result, the electrically conductive material 68 can prevent oxidation of the respective surfaces of the first and second portions of the second wrapping 78 that face each other. Because the electrically conductive material 68 is disposed in an interface between the respective surfaces of the first and second portions of the second wrapping 78 that face each other, the electrically conductive material 68 prevents oxidizing of the respective surfaces of the first and second portions of the second wrapping 78 that face each other when they slide along each other during operation as the electrical cable 50 is bent. The electrically conductive material 68 can be disposed in a portion up to a substantial entirety of the second overlapped region. Further, the electrically conductive material 68 can be confined to the second overlapped region, or can be disposed in one or more other locations in addition to the second overlapped region. In this regard, the electrically conductive material 68 can be applied to one or more surfaces of the second wrapping 78 that are predetermined to define the overlapped region once the second wrapping 78 is subsequently wrapped about the first wrapping 76.

As described above with respect to the first wrapping 76, the first wrapping 76 can define a plurality of first gaps 80. The first radially outer gaps 80*b* of the first wrapping 76 can be defined between the radially outer end 76*b* of the first wrapping 76 and the radially inner end 78*a* of the second wrapping 78. The second wrapping 78 can define a plurality of second gaps 82. At least one or more of the second gaps 82 can be second radially inner gaps 82*a* of the second wrapping 78. In particular, the second radially inner gaps 82*a* can be defined by the radially inner surface of the second wrapping 78 and the radially outer surface of the first wrapping 76. In this regard, one or more of the second radially inner gaps 82*a* may be continuous with one or more of the first radially outer gaps 80*b* in the radial direction. It should thus be appreciated that the second radially inner gaps 82*a* can also be referred to as the first radially outer gaps 80*b*, and vice versa.

As described above, Umicore Sealing 691 EL can be particularly advantageous as the electrically conductive material 68 when disposed at interfaces between radially adjacent metallic layers that radially overlap each other, such that the Umicore 691 EL is in mechanical and electrical contact with each of the metallic layers. The first wrapping 76 and the second wrapping 78 can define the radially adjacent metallic layers in some examples. The Umicore 691 EL or suitable alternative electrically conductive material 68 can be applied to at least one or both of the radially outer end of the first wrapping 76 and the radially inner end of the second wrapping 78. It should be appreciated that the electrical shield 58 can be include a metallic coating as opposed to the first wrapping 76. The metallic coating can coat the radially outer end 54*b* of the inner electrical insulator 54. The metallic coating can be configured as silver, gold, copper, or alloys thereof. The metallic coating can be flexible to allow for bending of the electrical cable 50.

The second radially inner gaps 82*a* can be defined in the intermediate interface 83 between the radially outer end 76*b* of the first wrapping 76 and the radially inner end 78*a* of the second wrapping 78. In particular, the intermediate interface 83 can define a radial thickness at the second radially inner gaps 82*a* that is greater than the radial thickness of the intermediate interface 83 at locations circumferentially spaced from the second radially inner gaps 82*a*. It should be appreciated that the term "circumferentially" applies to cables having a single cable and first and second electrical conductors, even though cables having first and second electrical conductors may not define a circular cross-section.

Alternatively or additionally, at least one or more of the second gaps 82 can be second radially outer gaps 82*b* of the second wrapping 78. In particular, the second radially outer gaps 82*b* can be defined by the radially outer surface 78*b* of the second wrapping 78 and the outer electrical insulator 55. The second radially outer gaps 82*b* can be defined by the radially outer interface 85 between the radially outer end 78*b* of the second wrapping 78 and the outer electrical insulator 55. In particular, the radially outer interface 85 can define a radial thickness at the second radially outer gaps 82*b* that is greater than the radial thickness of the radially outer interface 85 at locations circumferentially spaced from the second radially outer gaps 82*b*.

The electrical cable 50 can include the electrically conductive material 68 that can be configured to occupy at least one of the second gaps 82, up to a plurality of the second gaps 82 or all of the second gaps 82. For instance, the electrically conductive material 68 can flow into the second gaps 82 when the electrical cable 50 is bent. Alternatively or additionally, a portion of the electrically conductive material 68 can be applied to, and thus predisposed on, one or more locations of the second wrapping 78 that at least partially define respective ones of the second gaps 82 when the electrical cable 50 is bent. For instance, a portion of the electrically conductive material 68 can be applied to, and thus predisposed on, one or more locations of the second wrapping 78 that at least partially define respective ones of the second radially outer gaps 82*b* when the electrical cable 50 is bent. Alternatively or additionally, a portion of the electrically conductive material 68 can be applied to, and thus predisposed on, one or more locations of the second wrapping 78 that at least partially define respective ones of the second radially inner gaps 82*a* when the electrical cable 50 is bent. Alternatively or additionally still, a portion of the electrically conductive material 68 can be applied to, and thus predisposed on, one or more locations of the first wrapping 76 that at least partially define respective ones of the second radially inner gaps 82*a* when the electrical cable 50 is bent.

Depending on where the electrically conductive material 68 is applied, the electrically conductive material 68 can be disposed in one or more of the second gaps 82 when the gaps 82 are created without flowing into the gaps 80. Alternatively or additionally, the electrically conductive material 68 can flow into one or more others of the gaps 82. Further, in examples whereby the electrically conductive material 68 coats at least a portion of the second wrapping 78, or any of the wrappings described herein, the electrically conductive material 68 can resist the formation of the second gaps 82. That is, for a given bend of the electrical cable 50, the second wrapping 78 can produces more gaps 82 when the second wrapping 78 is not coated with the electrically conductive material 68 as compared to when the second wrapping 78 is coated with the electrically conductive material 68.

As illustrated in FIGS. 6A-6B, the electrically conductive material 68 can be disposed in the radially inner interface 79 between the radially inner end 76*a* of the first wrapping 76 and the inner electrical insulator 54 as described above. Alternatively or additionally, the electrically conductive material 68 can be disposed at the intermediate interface 83 that is defined between the radially outer end 76*b* of the first wrapping 76 and the radially inner end 78*a* of the second wrapping 78. For instance, the intermediate interface 83 can be defined by the radially outer end 76*b* first wrapping 76 and the radially inner end 78*a* of the second wrapping 78.

For instance, the electrically conductive material 68 can be applied to the radially inner surface of the second wrapping 78 so as to be disposed in at least a portion of the intermediate interface 83. In this regard, it should be appreciated that the electrically conductive material 68 can be applied to a surface of the second wrapping 78 that is predetermined to define the radially inner surface of the second wrapping 78 once the second wrapping 78 is subsequently wrapped about the first wrapping 76. The electrically conductive material 68 can be applied to at least a portion of the surface of the second wrapping 78 up to a substantial entirety of the surface of the second wrapping 78 as desired.

Alternatively or additionally, the electrically conductive material 68 can be applied to the radially outer surface of the first wrapping 76 so as to be disposed in at least a portion of the intermediate interface 83. In this regard, the electrically conductive material can be applied to the radially outer surface of the first wrapping 76 after the first wrapping 76 has been wrapped about the inner electrical insulator 54. Alternatively or additionally, it should be appreciated that the electrically conductive material 68 can be applied to a surface of the first wrapping 76 that is predetermined to define the radially outer surface of the first wrapping 76 once the first wrapping 76 is subsequently wrapped about the inner electrical insulator 54. The electrically conductive material 68 can be applied to at least a portion of the radially outer surface of the first wrapping 76 up to a substantial entirety of the radially outer surface of the first wrapping 76.

Alternatively or additionally still, the electrically conductive material 68 can be disposed at the radially outer interface 85 that is defined between the radially outer end 76*b* of the second wrapping 78 and the radially inner end 55*a* of the outer electrical insulator 55. For instance, the intermediate interface 83 can be defined by the radially outer end 78*b* second wrapping 78 and the radially inner end 55*a* of the outer electrical insulator 55.

In one example, the electrically conductive material 68 can be applied to the radially outer surface of the second wrapping 78 so as to be disposed in at least a portion of the radially outer interface 85. For instance, the electrically conductive material 68 can be applied to the radially outer surface of the second wrapping 78 after the second wrapping 78 has been wound about the first wrapping 76. Alternatively or additionally, the electrically conductive material 68 can be applied to a surface of the second wrapping 78 that is predetermined to define the radially outer surface of the second wrapping 78 once the second wrapping 78 is subsequently wrapped about the first wrapping 76. The electrically conductive material 68 can be applied to at least a portion of the surface of the second wrapping 78 up to a substantial entirety of the surface of the second wrapping 78 as desired.

Alternatively or additionally, the electrically conductive material 68 can be applied to the radially inner surface of the outer electrical insulator 55 so as to be disposed in at least a portion of the radially outer interface 85. The electrically conductive material 68 can be applied to at least a portion of the radially inner surface of the outer electrical insulator 55 up to a substantial entirety of the radially inner surface of the outer electrical insulator 55.

Thus, in one embodiment illustrated in FIG. 6B, the electrically conductive material 68 can be disposed in at least a portion up to an entirety of the radially inner interface 79, at least a portion up to an entirety of the intermediate interface 83, and at least a portion up to an entirety of the radially outer interface 85. Accordingly, the electrically conductive material 68 can be disposed in the overlapped regions of one or both of the first wrapping 76 and the second wrapping 78.

Further, as illustrated in FIG. 6C, it is appreciated that in some examples that when the electrically conductive material 68 is flowable, the electrically conductive material 68 disposed in the intermediate interface 83 can flow into the both the respective first radially outer gaps 80*b* and the second radially inner gaps 82*a* when the electrical cable 50 is bent. Alternatively or additionally, the electrically conductive material 68 can be predisposed in the intermediate interface 83 at a location that defines one or both of a first radially outer gap 80*b* and a second radially inner gap 82*a*. Similarly, electrically conductive material 68 disposed in the radially outer interface 85 can flow into the respective second radially outer gaps 82*b* when the electrical cable 50 is bent. Alternatively or additionally, the electrically conductive material 68 can be predisposed in the radially outer interface 85 at a location that defines one of the second radially outer gaps 82*b* when the electrical cable 50 is bent. The term "predisposed" can indicate a disposition prior to flowing of the flowable electrically conductive material.

The electrically conductive material 68 can be disposed in the radially inner interface 79 by coating the inner electrical insulator 54. Alternatively or additionally, the electrically conductive material 68 can be disposed in the radially inner interface 79 by coating the radially inner surface of the first wrapping 76. The electrically conductive material 68 can be disposed in the intermediate interface 83 by coating the radially outer surface of the first wrapping 76. Alternatively or additionally, the electrically conductive material 68 can be disposed in the intermediate interface 83 by coating the radially inner surface of the second wrapping 78. The electrically conductive material 68 can be disposed in the radially outer interface 85 by coating the radially outer surface of the second wrapping 78. Alternatively or additionally, the electrically conductive material 68 can be disposed in the radially outer interface 85 by coating the radially inner surface of the outer electrical insulator 55.

Figure 6D:
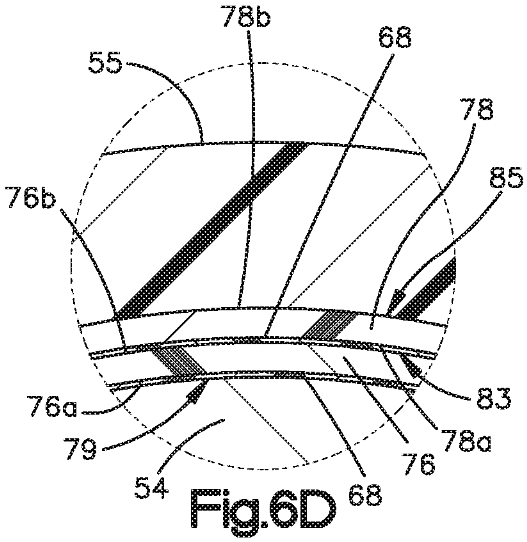
FIG. 6D is an enlarged sectional end elevation view of the region of an electrical cable illustrated in FIG. 6B but showing the electrically conductive material localized at the radially inner and outer surfaces of the first wrapping, and the radially inner surface of the second wrapping.

It should be appreciated, however, that the electrically conductive material 68 can be disposed in at least a portion up to an entirety of one or more up to each of the radially inner interface 79, the intermediate interface 83, and the radially outer interface 85, in any combination as desired. For instance, as illustrated in FIG. 6D, the electrically conductive material 68 can be disposed in the inner interface 79 and the intermediate interface 83, but not the outer interface 85. Thus, the electrically conductive material 68 can be disposed in at least one or more of the first radially inner gaps 80*a*. Further, the electrically conductive material 68 can be disposed in at least one or more of the first radially outer gaps 80*b*. Further still, the electrically conductive material 68 can be disposed in at least one or more of the second radially inner gaps 82*a*. Accordingly, the electrically conductive material 68 can be disposed in ones of the first gaps 80 and ones of the second gaps 82.

Figure 6E:
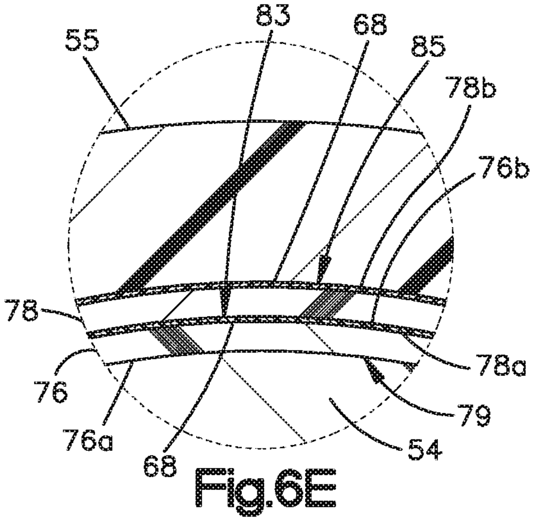
FIG. 6E is an enlarged sectional end elevation view of the region of an electrical cable illustrated in FIG. 6B but showing the electrically conductive material localized at the radially inner and outer surfaces of the second wrapping, and the radially outer surface of the first wrapping.

Alternatively, as illustrated in FIG. 6E, the electrically conductive material 68 can be disposed in at least a portion up to an entirety of one or more up to each of the intermediate interface 83 and the radially outer interface 85, but not in the radially inner interface 79. Thus, the electrically conductive material 68 can be disposed in at least one or more of the first radially outer gaps 80*b*. Further, the electrically conductive material 68 can be disposed in at least one or more of the second radially inner gaps 82*a*. Further still, the electrically conductive material 68 can be disposed in at least one or more of the second radially outer gaps 82*b*. Accordingly, the electrically conductive material 68 can be disposed in ones of the first gaps 80 and ones of the second gaps 82.

Figure 6F:
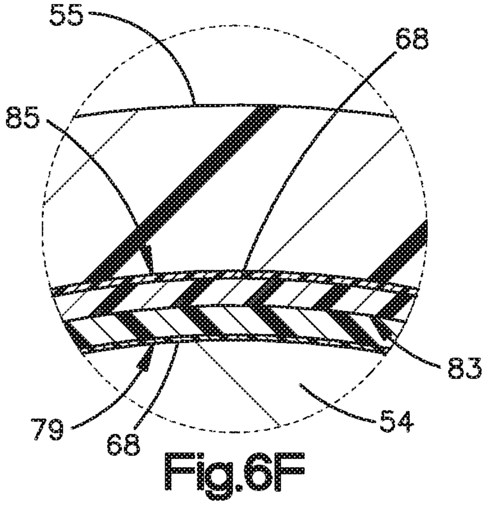
FIG. 6F is an enlarged sectional end elevation view of the region of an electrical cable illustrated in FIG. 6B but showing the electrically conductive material localized at the radially inner surface of the first wrapping and the radially outer surface of the second wrapping.

Alternatively, as illustrated in FIG. 6F, the electrically conductive material 68 can be disposed in at least a portion up to an entirety of one or more up to each of the radially inner interface 79 and the radially outer interface 85, but not in the intermediate interface 83. Thus, the electrically conductive material 68 can be disposed in at least one or more of the first radially inner gaps 80*a*. Further, the electrically conductive material 68 can be disposed in at least one or more of the second radially outer gaps 82*b*. Accordingly, the electrically conductive material 68 can be disposed in ones of the first gaps 80 and ones of the second gaps 82.

Figure 6G:
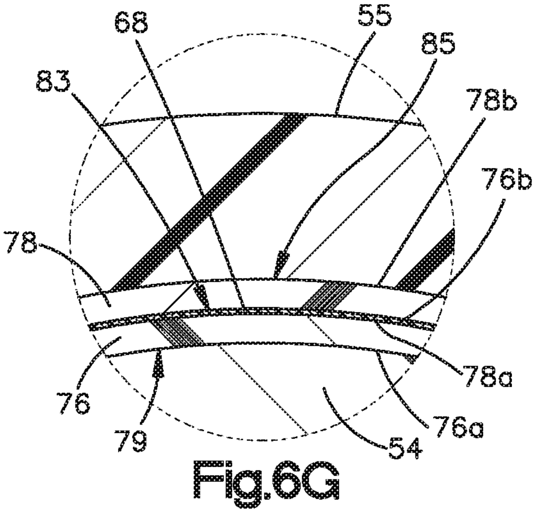
FIG. 6G is an enlarged sectional end elevation view of the region of an electrical cable illustrated in FIG. 6B but showing the electrically conductive material localized at the radially outer surface of the first wrapping and the radially inner surface of the second wrapping.

Alternatively, as illustrated in FIG. 6G, the electrically conductive material 68 can be disposed in at least a portion up to an entirety of the intermediate interface 83, but not in the radially inner interface 79 and not in the radially outer interface 85. Thus, the electrically conductive material 68 can be disposed in at least one or more of the first radially outer gaps 80*b*. Further, the electrically conductive material 68 can be disposed in at least one or more of the second radially inner gaps 82*a*. Accordingly, the electrically conductive material 68 can be disposed in ones of the first gaps 80 and ones of the second gaps 82.

Figure 6H:
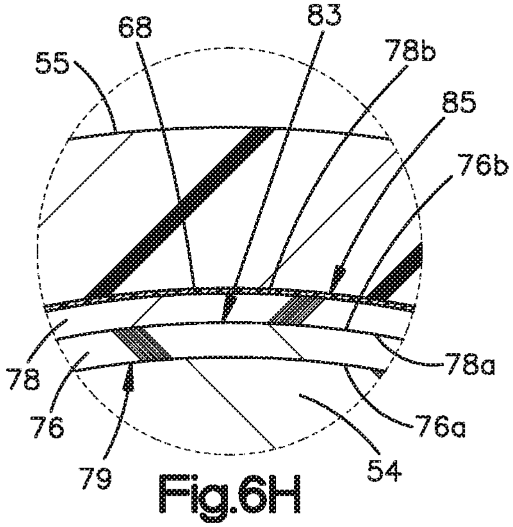
FIG. 6H is an enlarged sectional end elevation view of the region of an electrical cable illustrated in FIG. 6B but showing the electrically conductive material localized at the radially outer surface of the second wrapping.

Alternatively, as illustrated in FIG. 6H, the electrically conductive material 68 can be disposed in at least a portion up to an entirety of the radially outer interface 85, but not in the radially inner interface 79 and not in the intermediate interface 83. Thus, the electrically conductive material 68 can be disposed in at least one or more of the second radially outer gaps 82*b*.

Figure 6I:
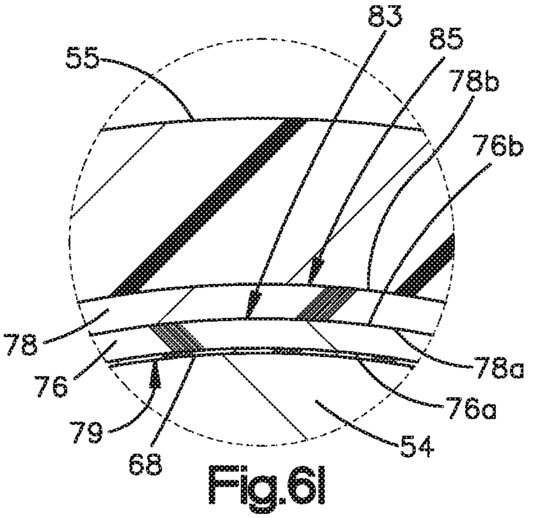
FIG. 6I is an enlarged sectional end elevation view of the region of an electrical cable illustrated in FIG. 6B but showing the electrically conductive material localized at the radially inner surface of the first wrapping.

Alternatively, as illustrated in FIG. 6I, the electrically conductive material 68 can be disposed in at least a portion up to an entirety of the radially inner interface 79, but not in the intermediate interface 83 and not in the radially outer interface 85. Thus, the electrically conductive material 68 can be disposed in at least one or more of the first radially inner gaps 80*a*.

As described above with respect to FIG. 4E, it is recognized that the second electrically conductive wrapping 78 can include a first portion and a second portion that radially overlaps the first portion as the second electrically conductive wrapping 78 is wound about the first electrically conductive wrapping so as to define a second radially overlapped region at an interface between the first and second portions of the second electrically conductive wrapping. Thus, the second electrically conductive wrapping 78 can overlap itself as it is wound about the first electrically conductive wrapping 76 so as to define a second overlapped region. As described above, Umicore Sealing 691 EL can be particularly advantageous as the electrically conductive material 68 when disposed at interfaces between radially adjacent metallic layers that radially overlap each other, such that the Umicore 691 EL is in mechanical and electrical contact with each of the metallic layers. The first and second portions of the second wrapping 78 can define the radially adjacent metallic layers in some examples. The Umicore 691 EL or suitable alternative electrically conductive material 68 can be applied to at least one or both of the radially outer end of the second wrapping 78 of the first portion and the radially inner end of the second wrapping 78 at the second portion.

Further, the second electrically conductive wrapping 78 thus defines at least one radial gap, such as at least one second radial gap, disposed between the second wrapping 78 and the first wrapping 76 along the radial direction. The radially outer end of the second radial gap is thus defined by the second wrapping 78. The radially inner end of the second radial gap can be defined by the electrically conductive material 86. It should be appreciated that the second radially inner gaps 82*a* can thus be defined when the electrical cable is bent as described above. Alternatively or additionally, the second radially inner gaps 82*a* can be defined by the second radial gap when the electrical cable is not bent.

Thus, in one example, the electrically conductive material 68 can be disposed between the radially outer end 76*b* of the first wrapping 76 and the radially inner end 78*a* of the second wrapping 78. For instance, at least a portion of the electrically conductive material 68 can be confined between the inner electrical insulator 54 and the first wrapping 76. In one example, at least 60% of the electrically conductive material by volume that is disposed between the first and second wrappings 76 and 78 can be confined between the inner electrical insulator 54 and the electrical shied 58 with respect to the radial direction. For instance, at least 70% of the electrically conductive material by volume that is disposed between the first and second wrappings 76 and 78 can be confined between the inner electrical insulator 54 and the electrical shied 58 with respect to the radial direction. In one example, at least 80% of the electrically conductive material by volume that is disposed between the first and second wrappings 76 and 78 can be confined between the inner electrical insulator 54 and the electrical shied 58 with respect to the radial direction. For example, at least 90% of the electrically conductive material by volume that is disposed between the first and second wrappings 76 and 78 can be confined between the inner electrical insulator 54 and the electrical shied 58 with respect to the radial direction. In one example, an entirety of the electrically conductive material 68 that is disposed between the first and second wrappings 76 and 78 can be confined between the first and second wrappings 76 and 78, and thus at the intermediate interface 83 with respect to the radial direction.

In this regard, it should be appreciated that the electrically conductive material 68 can be a solid or non-flowable material. Thus, the second wrapping 78 can be surround the electrically conductive material 68. In one example, the electrically conductive material 68 can coat the radially outer surface of the radially outer end 76*b* of the inner wrapping 76. Thus, the second wrapping 78 can be wound around the electrically conductive material 68. In this regard, it should be appreciated that the electrically conductive material 68 can be a solid or non-flowable material. Thus, the second wrapping 78 can be surround the first wrapping 76. In one example, the electrically conductive material 68 can coat the radially outer surface of the first wrapping 76. Thus, the second wrapping 78 can be wound around the electrically conductive material 68. The electrically conductive material 68 can be allowed to dry (for instance when the electrically conductive material 68 comprises CNT) prior to winding the second wrapping 78 around the electrically conductive material 68.

In one example, the electrically conductive material 68 can be applied to a substantial entirety of the radially outer surface of the first wrapping 76. Alternatively, the electrically conductive material 68 can be applied to the radially outer surface of the first wrapping 76 in a helical pattern along the radially outer surface. The helical pattern can be aligned with the second radial gap, which can also extend substantially in a helical pattern. In another example, the electrically conductive material 68 can coat at least a portion of the radially inner surface of the second wrapping 78 prior to surrounding the first wrapping 76 with the second wrapping 78.

It should be appreciated that one or more up to all of the wrappings disclosed herein can overlap each other such that the region of overlap 77 is a helical region of overlap as illustrated in FIG. 7A. For instance, the first wrapping 76 can define a helical region of overlap. The second wrapping 78 can also define a helical region of overlap 77. Alternatively, as illustrated in FIG. 7B, one or more up to all of the wrappings disclosed herein can have axial regions of overlap 77 that extend in the axial direction. For instance, the first wrapping 76 can have an axial region of overlap 77. While the second wrapping 78 is illustrated as having a helical region of overlap 77, it should be appreciated that the second wrapping 78 can alternatively have an axial region of overlap 77. In one example, the axial region of overlap does not make an entire circumferential revolution about the central axis of the cable. The axial regions of overlap can thus extend substantially parallel to the central axis of the electrical cable. Such wrappings can be referred to as a longitudinal wrap. Alternatively, adjacent windings of one or more up to all of the wrappings disclosed herein can abut each other so as to not overlap each other, thereby defining a seam between adjacent windings. The seam can extend along a helical path in one example. In another example, the seam can extend axially substantially axially, or parallel to the central axis of elongation of the electrical cable, and does not make an entire circumferential revolution about the central longitudinal axis of the cable. It is recognized that any one up to all wrappings having helical overlaps described herein can be replaced by longitudinal wraps.

It should thus be appreciated that the radially outer end of the second radial gap can be defined by the second wrapping 78, and the inner radial end of the second radial gap can at least partially defined by the first wrapping 76. For instance, the inner radial end can be entirely defined by the electrically conductive material 68. Without being bound by theory, the present inventors recognize that the electrical performance of the cable can be improved when at least a portion of the inner radially end of the second radial gap is defined by the electrically conductive material 68.

Figure 8:
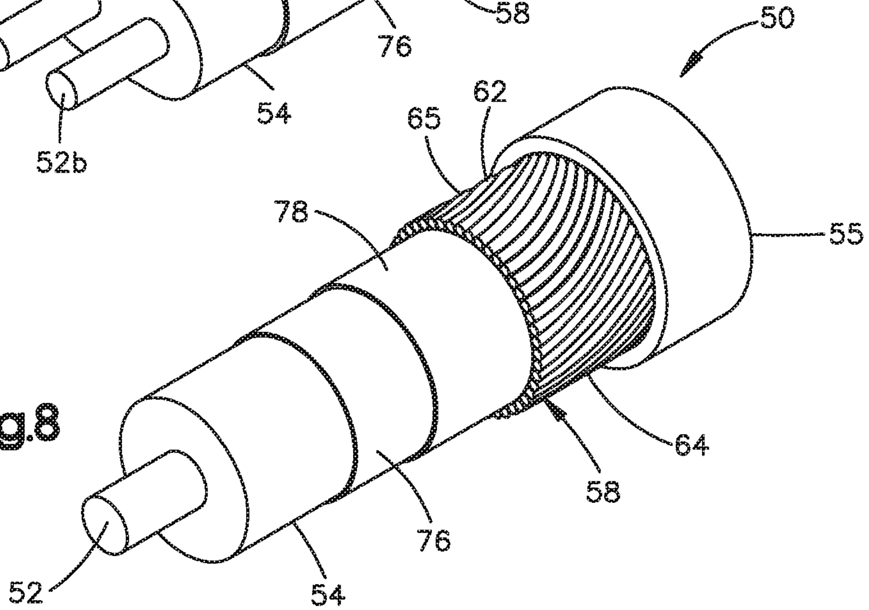
FIG. 8 is a perspective view of an electrical cable configured as a microwave cable constructed in accordance with another embodiment with portions removed to illustrate first and second electrically conductive wrappings and an electrically conductive braid that surrounds the second electrically conductive wrapping.

Referring now to FIG. 8, the electrical cable 50 can be configured as a microwave cable. Thus, the electrical shield 58 can include the first and second wrappings 76 and 78 as described above with respect to FIGS. 6A-7B, and the braid 65 as described above with respect to FIGS. 2A-3D. The braid 65 can wrap around the second wrapping 78. For instance, the braid 65 can be helically wrapped around the second wrapping 78. Thus, the braid 65 can be constructed in the manner described above in FIGS. 2A-3D with respect to the serve shield 60. The radially outer interface can be defined by the radially outer surface of the second wrapping 78 and the radially inner end of the braid 65. Accordingly, the second radially outer gaps 82*b* can be defined between the radially outer surface of the second wrapping 78 and the strands 62 that define the winding 64.

The electrical shield 58 can include the electrically conductive material 68 in any manner described above. For instance, the electrically conductive material 68 can be disposed in any one or more up to all of the inner interface 79, the intermediate interface 83, and the outer interface 85 as described above with respect to FIGS. 6A-6I. Alternatively or additionally, the electrically conductive material 68 can be applied to the braid 65 in the manner described above with respect to the serve shield 60 illustrated in FIGS. 2A-3D. As described above, Umicore Sealing 691 EL can be particularly advantageous as the electrically conductive material 68 when disposed at interfaces between radially adjacent metallic layers that radially overlap each other, such that the Umicore 691 EL is in mechanical and electrical contact with each of the metallic layers. The second wrapping 78 and the braid 65 can define the radially adjacent metallic layers in some examples. The Umicore 691 EL or suitable alternative electrically conductive material can be applied to at least one or both of the radially outer surface of the second wrapping 78 and the radially inner surface of the braid 65. Further, the electrically conductive material 68 can be disposed between the electrically conductive braid 65 and the outer electrical insulator 55. It should be appreciated that the interfaces can be defined by any one or more of the interfaces described herein.

As described above, the electrically conductive material 68 can be applied to any suitable at least one or more surface of the electrical cable 50 as desired. The at least one or more surface can be configured as one or more up to all of the inner electrical insulator 54, the first wrapping 76, the second wrapping 78, the braid 65, and the second electrical insulator 55. For instance, the electrically conductive material 68 can be applied as a coating. In one example, the electrically conductive material 68 can be sprayed onto the surface. Alternatively or additionally, the electrically conductive material 68 can be brushed onto the surface. Alternatively or additionally still, the electrically conductive material 68 can be provided as a liquid bath, and the surface can be submerged in the liquid bath. In still other examples, the electrically conductive material 68 can be chemical vapor deposited (CVD) onto the surface. Alternatively or additionally, the electrically conductive material 68 can be plasma-applied to the surface. Alternatively or additionally still, the electrically conductive material 68 can be electroplated onto the surface. Alternatively or additionally still, the electrically conductive material 68 can be dispersion-coated onto the surface.

In certain embodiments described herein, when the electrically conductive material 68 is applied to the surface as a liquid, the electrically conductive material 68 can be cured so as to increase the viscosity of the electrically conductive material 68. For instance, the electrically conductive material 68 can be subjected to infrared light. Alternatively or additionally, the electrically conductive material 68 can be subjected to ultraviolet light. The electrically conductive material 68 can be flowable in the manner described herein after it is cured.

Figure 9A:
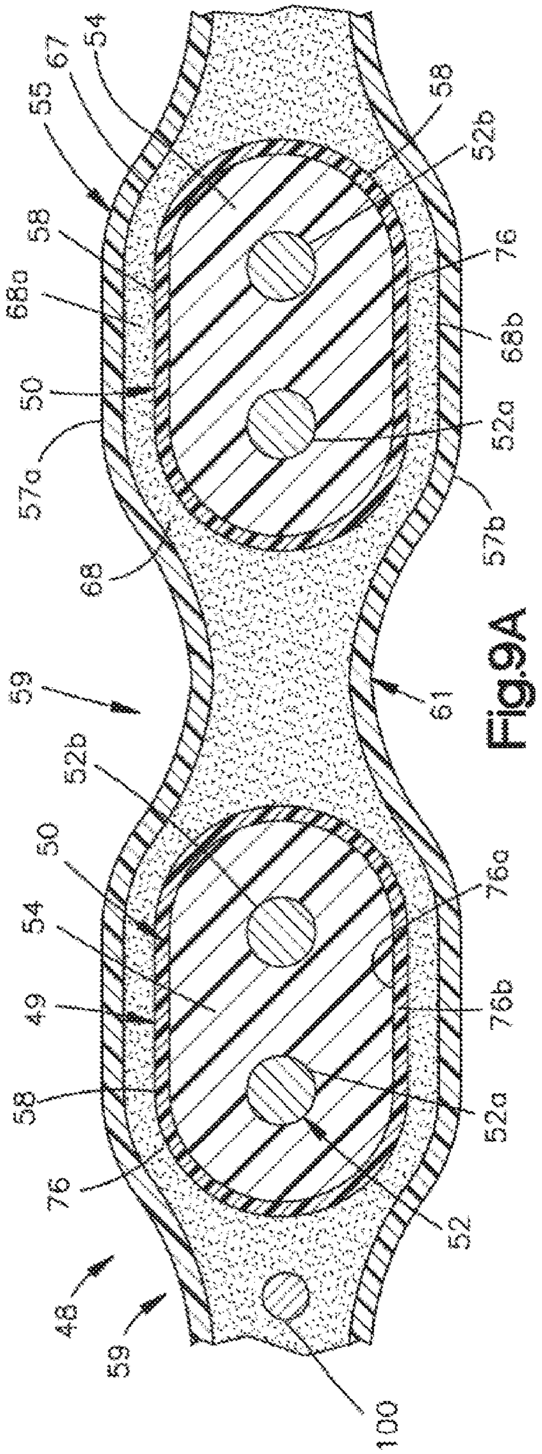
FIG. 9A is a cross-sectional view of a portion of an electrical cable ribbon constructed in accordance with one example.
Figure 9B:
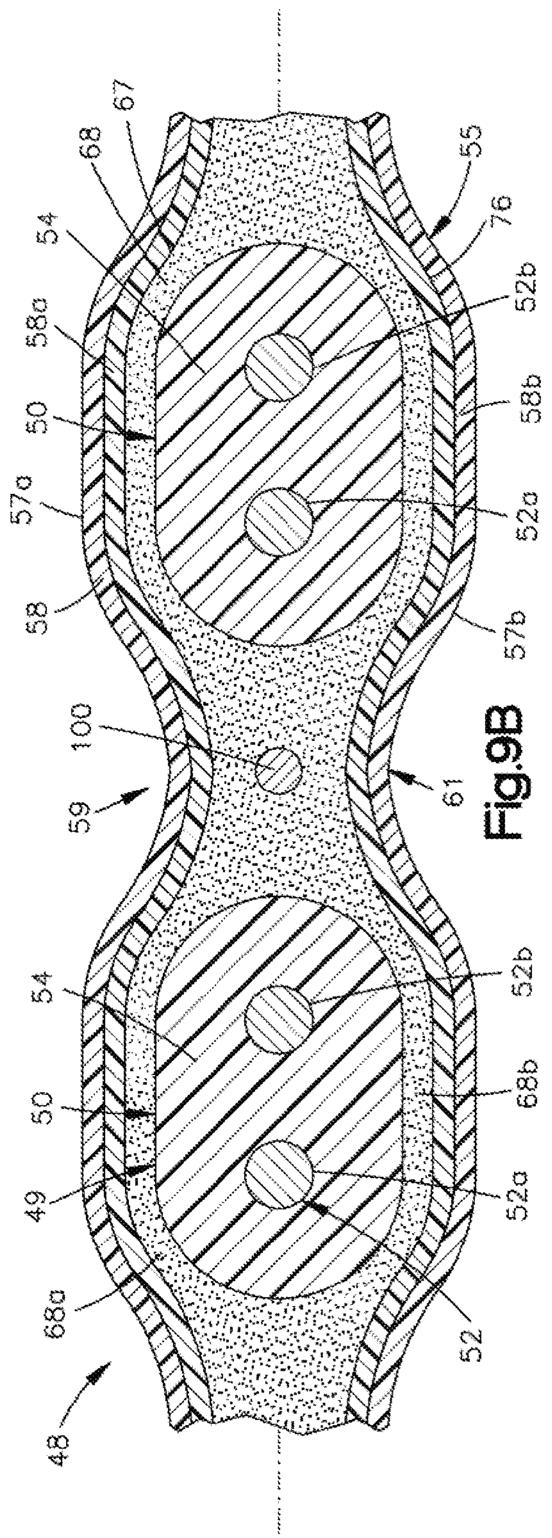
FIG. 9B is a cross-sectional view of a portion of an electrical cable ribbon constructed in accordance with another example.
Figure 9C:
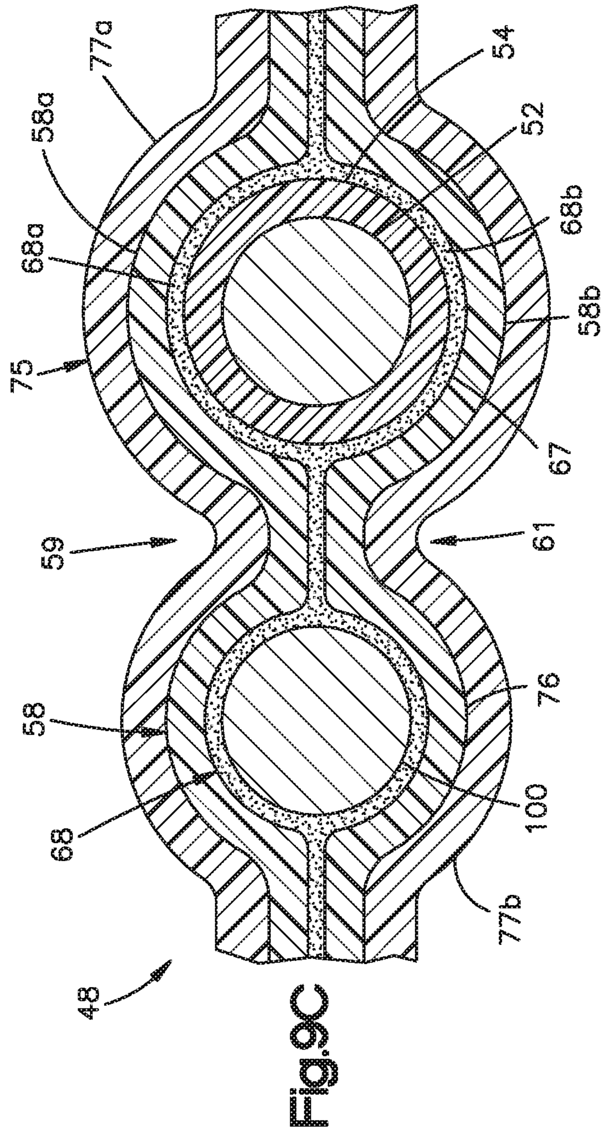
FIG. 9C is a cross-sectional view of a portion of an electrical cable ribbon constructed in accordance with still another example.

Referring now to FIG. 9A-9C, an electrical cable ribbon 48 can include plurality of groups 49 of electrical cables 50 that can be constructed in accordance with any example described herein. The electrical cables can be adjacent to each other along a row. Each of the plurality of electrical cables 50 can include the at least one electrical conductor 52 surrounded by the inner electrical insulator 54. The at least one electrical conductor 52 of each of the electrical cables 50 can include the first and second coextruded electrical conductors 52*a* and 52*b*. Alternatively, the at least one electrical conductor 52 can be only a single electrical conductor 52.

Referring now to FIG. 9A, each of the electrical cables 50 of the ribbon 48 can include an electrical shield 58 of the type described herein. Thus, the electrical shield 58 can be include an electrically conductive wrapping 76 that defines a radially inner end 76*a* that faces the inner electrical insulator 54 and a radially outer end 76*b* that is opposite the radially inner end 76*a* (see FIGS. 7A-7B). The wrapping 76 can radially overlap itself so as to define an overlapped region 77. The wrapping 76 can be helically wrapped, such that the overlapped region 77 is a helical overlapped region as illustrated in FIG. 7A. For instance, the overlapped region 77 can define a plurality of revolutions about the inner electrical insulator 54. Alternatively, as illustrated in FIG. 7B, the wrapping 76 can be a longitudinal wrapping, such that the overlapped region 77 is an axially overlapped region that extends substantially along an axial direction of elongation of the electrical cable 50, and thus of the ribbon 54.

The electrical cable ribbon 48 can further include an electrically conductive coating of the type described above that is disposed in the overlapped region 77. The electrical coating can be an anti-oxidation agent in some examples. The coating can be a paste, gel, adhesive, or any suitable alternative coating as described herein. The electrically conductive coating can be disposed in an entirety of the overlapped region. The electrically conductive coating can be applied to a substantial entirety of the radially inner end 76*a* of the wrapping. Alternatively or additionally, the electrically conductive coating can be applied to a substantial entirety of the radially outer 76*b* end of the wrapping 77. The electrical coating can be confined to the overlapped region.

With continuing reference to FIG. 9A, the electrical shield 58 can be disposed about the inner electrical insulator 54 of each electrical cable 50. For instance, the electrical shield 58 can abut the outer perimeter of the inner electrical insulator 54. Alternatively, each of the electrical cables 50 can include a coating that is applied to the radially outer end 54*b* of the inner electrical insulator 54 in the manner described above. Thus, the coating can be metallic. For instance, the coating can be made of silver, gold, copper, or alloys thereof. In this regard, the electrical shield 58 can abut the outer perimeter of the electrical coating.

The cable ribbon 48 can further include the outer electrical insulator 55 of the type described above. However, the outer electrical insulator 55 having first and second ends 57*a* and 57*b* that are opposite each other, and disposed such that each electrical shield 58 of the electrical cables 50 are disposed between the first end second ends 57*a* and 57*b* of the outer electrical insulator 55. The outer electrical insulator 55, including each of the first and second ends 57*a* and 57*b*, can further extend along interstices 59 that extend between adjacent ones of the electrical cables 50 of the electrical cable ribbon 48. The outer electrical insulator 55 can be laminated to the electrical shields 58. For instance, the first and second ends 57*a* and 57*b* of the outer electrical insulator can be laminated to opposed ends of the electrical shields 58.

The electrical cable ribbon 48 can further include an adhesive 67 that is disposed between the outer electrical insulator 55 and the electrical shield 58. The adhesive 67 can be an epoxy in one example, but can be configured as any suitable alternative adhesive as desired. The adhesive 67 can thus bond the outer electrical insulator 55 to the electrical shield 58. Accordingly, the outer electrical insulator 55 can be laminated to the electrical shield 58. In one example, the adhesive 67 can be configured as an electrically conductive material 68 of the type described herein. The electrically conductive material 68 can be disposed between each electrical shield 58 and the outer electrical insulator 55. For instance, the electrically conductive material 68, and thus the adhesive 67, can include a first portion 68*a* that is disposed between each electrical shield 58 and the first end 57*a* of the outer electrical insulator 55. In particular, the first portion 68*a* can extend from each electrical shield 58 to the first end 57*a*. The electrically conductive material 68 can include a second portion 68*b* that is disposed between each electrical shield 58 and the second end 57*b* of the outer electrical insulator 55. In particular, the second portion 68*b* can extend from each electrical shield 58 to the second end 57*b*. The first and second ends 57*a* and 57*b* can be oriented substantially parallel to each other along the axial direction. The electrically conductive material 68 can further be disposed between the first and second ends 57*a* and 57*b* in the interstices 59. For instance, the electrically conductive material 68 can extend from the first end 57*a* to the second end 57*b* in the interstices 59.

Further, the electrical cable ribbon 48 can include at least one drain wire 100 disposed in at least one of the interstices 59. For instance, the electrical cable ribbon 48 can include a plurality of drain wires 100 disposed in different ones of the interstices 59. The drain wires 100 can be in electrical communication with the electrical shields 58. For instance, the electrically conductive material 68 can establish an electrically conductive path from the electrical shields 58 to the drain wires 100. The drain wires 100 can be disposed between the first and second ends 57*a* and 57*b* of the outer electrical insulator 55 at a location spaced from the electrical shields 58 of the electrical cables 50 of the electrical cable ribbon 54. The drain wires 100 can be disposed in a necked location 61 of the cable ribbon 54. In some examples, the electrical cable ribbon 48 can be devoid of a drain wire. The first and second ends 57*a* and 57*b* can extend toward each other in the interstices 59 so as to define the necked location 61. In one example, the first and second ends 57*a* and 57*b* remain spaced from each other at the necked location 61.

Figure 9D:
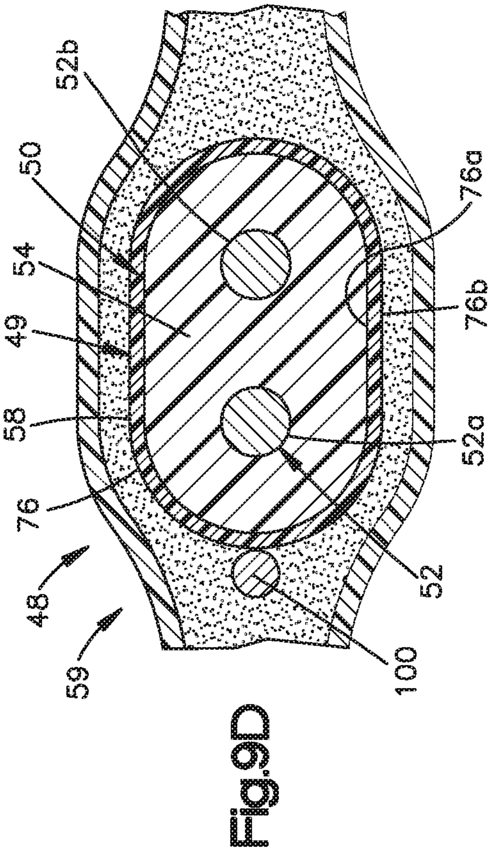
FIG. 9D is a cross-sectional view of a portion of the electrical cable ribbon as illustrated in FIG. 9A.

Alternatively, as illustrated in FIG. 9D, the at least one drain wire 100 can contact a respective at least one electrical shield 58. Accordingly, the adhesive 67 can be electrically nonconductive. In this example, because the adhesive 67 does not place the drain wire 100 in electrical communication with the electrical shields. Thus, the at least one drain wire 100 can contact a respective at least one electrical shield 58 so as to place the at least one drain wire 100 in electrical communication with the at least one electrical shield 58. In one example, the electrical cable ribbon 48 can include a plurality of drain wires 100 that each contact a respective electrical shield 58. Further, each electrical shield 58 can contact a respective drain wire 100.

Referring now to FIG. 9B, the electrical cable ribbon 48 can include a plurality of groups 49 of electrical cables 50. The electrical cables 50 can each include at least one electrical conductor 52. For instance, the electrical cables can include first and second coextruded electrical conductors 52*a* and 52*b* as described above. The electrical cables 50 of the ribbon 48 can be spaced from each other along a row, and the electrical conductors 52*a* and 52*b* of each pair of electrical conductors can be spaced from each other along the row. The electrical cables 50 can further each include an inner electrical insulator 54 that surrounds the at least one electrical conductor 52 as described above.

The electrical cable ribbon 48 can further include an electrical shield 58 that extends over the electrical insulators 54 of each electrical cable 50 of the electrical cable ribbon 48. The electrical shield 58 can define a first shield end 58*a* and a second shield end 58*b*, disposed such that each inner electrical insulator 54 is disposed between the first end second shield ends 58*a* and 58*b*. The electrical shield 58 can be a single unitary structure. The electrical shield 58 can further extend along interstices 59 disposed between adjacent ones of the electrical cables 50. The electrical shield 58 can be include an electrically conductive wrapping 76 that defines a radially inner end 76*a* that faces the inner electrical insulator 54 and a radially outer end 76*b* that is opposite the radially inner end 76*a* (see FIGS. 7A-7B). The wrapping 76 can radially overlap itself so as to define an overlapped region 77. The wrapping 76 can be helically wrapped, such that the overlapped region 77 is a helical overlapped region as illustrated in FIG. 7A. For instance, the overlapped region 77 can define a plurality of revolutions about the inner electrical insulator 54. Alternatively, as illustrated in FIG. 7B, the wrapping 76 can be a longitudinal wrapping, such that the overlapped region 77 is an axially overlapped region that extends substantially along an axial direction of elongation of the electrical cable 50, and thus of the ribbon 54.

The electrical cable ribbon 48 can further include an electrically conductive coating of the type described above that is disposed in the overlapped region 77. The electrical coating can be an anti-oxidation agent in some examples. The coating can be a paste, gel, adhesive, or any suitable alternative coating as described herein. The electrically conductive coating can be disposed in an entirety of the overlapped region. The electrically conductive coating can be applied to a substantial entirety of the radially inner end 76*a* of the wrapping. Alternatively or additionally, the electrically conductive coating can be applied to a substantial entirety of the radially outer 76*b* end of the wrapping 77. The electrical coating can be confined to the overlapped region.

With continuing reference to FIG. 9B, the electrical shield 58 can be disposed about the inner electrical insulator 54 of each electrical cable 50. For instance, the electrical shield 58 can abut the outer perimeter of the inner electrical insulator 54. Alternatively, each of the electrical cables 50 can include a coating that is applied to the radially outer end 54*b* of the inner electrical insulator 54 in the manner described above. Thus, the coating can be metallic. For instance, the coating can be made of silver, gold, copper, or alloys thereof. In this regard, the electrical shield 58 can abut the outer perimeter of the electrical coating.

The electrical cable ribbon 48 can further include an adhesive 67 that is disposed between the inner electrical insulator 54 and the electrical shield 58. The adhesive 67 can be an epoxy in one example, but can be configured as any suitable alternative adhesive as desired. The adhesive 67 can thus bond the electrical shield 58 to the inner electrical insulator 54 or to the electrically conductive coating, if present, that is applied to the inner electrical insulator 54. Accordingly, the electrical shield 58 can be laminated to the inner electrical insulator 54. In one example, the adhesive 67 can be configured as an electrically conductive material 68 of the type described herein. The electrically conductive material 68 can be disposed between the electrical shield 58 and each inner electrical insulator 54. For instance, the electrically conductive material 68, and thus the adhesive 67, can include a first portion 68*a* that is disposed between the first shield end 58*a* and each inner electrical insulator 54. In particular, the first portion 68*a* can extend from the first shield end 58*a* to the inner electrical insulator 54 or the coating that surrounds the inner electrical insulator 54. The electrically conductive material 68 can further include a second portion 68*b* that is disposed between the second shield end 58*b* and each inner electrical insulator 54. In particular, the second portion 68*b* can extend from the second shield end 58*b* to the inner electrical insulator 54 or the coating that surrounds the inner electrical insulator 54. The first and second shield ends 58*a* and 58*b* can be oriented substantially parallel to each other along the axial direction. The electrically conductive material 68 can further be disposed between the first and second shield ends 58*a* and 58*b* in the interstices 59. For instance, the electrically conductive material 68 can extend from the first shield end 58*a* to the second shield end 58*b* in the interstices 59.

Further, the electrical cable ribbon 48 can include at least one drain wire 100 disposed in at least one of the interstices 59. For instance, the electrical cable ribbon 48 can include a plurality of drain wires 100 disposed in respective different ones of the interstices 59. The drain wires 100 can be in electrical communication with the electrical shield 58 of the electrical cable ribbon 48. For instance, the electrically conductive material 68 can establish an electrically conductive path from the electrical shield 58 to the drain wires 100. The drain wires 100 can be disposed between the first and second shield ends 58*a* and 58*b* of the outer electrical insulator 55 at a location spaced from the first and second shield ends 58*a* and 58*b*. The drain wires 100 can be disposed in a necked location 61 of the cable ribbon 48. In some examples, the electrical cable ribbon 48 can be devoid of a drain wire. The first and second shield ends 58*a* and 58*b* can extend toward each other in the interstices 59 so as to define the necked location 61. In one example, the first and second shield ends 58*a* and 58*b* remain spaced from each other at the necked location 61. In an alternative example, one or both of the first and second shield ends 58*a* and 58*b* can contact the at least one drain wire 100. For instance, the adhesive 67 can be electrically nonconductive in some examples. Thus, the at least one drain wire 100 can contact the electrical shield 58 so as to place the at least one drain wire 100 in electrical communication with the electrical shield 58.

The cable ribbon 48 can further include the outer electrical insulator 55 of the type described above. The outer electrical insulator 55 can have first and second ends 57*a* and 57*b* that are opposite each other, and disposed such that each electrical shield 58 of the electrical cables 50 are disposed between the first end second ends 57*a* and 57*b* of the outer electrical insulator 55. The first end 57*a* of the outer electrical insulator 55 can extend along the first shield end 58*a*. In particular, the first end 57*a* of the outer electrical insulator 55 can extend along the radially outer end of the first shield end 58*a*. Similarly, the second end 57*b* of the outer electrical insulator 55 can extend along the second shield end 58*b*. In particular, the second end 57*a* of the outer electrical insulator 55 can extend along the radially outer end of the second shield end 58*b*.

The outer electrical insulator 55, including each of the first and second ends 57*a* and 57*b*, can further extend along interstices 59 that extend between adjacent ones of the electrical cables 50 of the electrical cable ribbon 48. In particular, the first and second ends 57*a* and 57*b* can extend toward each other at the necked locations 61, which can be located at the interstices 59. The outer electrical insulator 55 can be a single unitary structure. The outer electrical insulator 55 can be laminated to the electrical shield 58. For instance, the first and second ends 57*a* and 57*b* of the outer electrical insulator can be laminated to the first and second shield ends 58*a* and 58*b*, respectively, of the electrical shields 58. Alternatively, the outer electrical insulator 55 can be thermally bonded to the electrical shield 58. In particular, the first and second ends 57*a* and 57*b* of the outer electrical insulator 55 can be thermally bounded to the first and second ends 58*a* and 58*b* of the electrical shield. Alternatively still, the electrical cable ribbon 48 can be devoid of the outer electrical insulator 55. Thus, the radially outer end of the electrical shield 58 can define the radially outer end of the electrical cable braid 54.

Referring now to FIG. 9C, each electrical cable 50 of the electrical cable ribbon 48 can include at least one electrical conductor 52, and an inner electrical insulator 54 that surrounds the at least one electrical conductor 52 in the manner described above. For instance, the at least one electrical conductor 52 can be a single electrical conductor 52. In one example, one or more of the electrical cables 50 can be configured as a coaxial cable. Alternatively, the electrical conductor 52 can be configured as an electrical power configured to transmit several volts of electrical power.

Further, the electrical cable ribbon 48 can include a drain wire 100 that is disposed adjacent the electrical conductor 52. The electrical cable ribbon 48 can define an interstice that is disposed between the drain wire 100 and the electrical cable 50. The electrical ribbon can include any number of electrical cables 50, such as one electrical cable 50, two electrical cables 50, or more than two electrical cables 50 that are arranged adjacent each other between first and second drain wires 100.

The electrical cable ribbon 48 can further include an electrical shield 58 that extends over the electrical insulators 54 of each electrical cable 50 of the electrical cable ribbon 48. Further, the drain wire 100 can be in electrical communication with the electrical shield 58. The electrical shield 58 can define a first shield end 58*a* and a second shield end 58*b*, disposed such that each inner electrical insulator 54 is disposed between the first end second shield ends 58*a* and 58*b*. The electrical shield 58 can be a single unitary structure. The electrical shield 58 can further extend along the interstices 59. The electrical shield 58 can be include an electrically conductive wrapping 76 that defines a radially inner end 76*a* that faces the inner electrical insulator 54 and a radially outer end 76*b* that is opposite the radially inner end 76*a* (see FIGS. 7A-7B). The wrapping 76 can radially overlap itself so as to define an overlapped region 77. The wrapping 76 can be helically wrapped, such that the overlapped region 77 is a helical overlapped region as illustrated in FIG. 7A. For instance, the overlapped region 77 can define a plurality of revolutions about the inner electrical insulator 54. Alternatively, as illustrated in FIG. 7B, the wrapping 76 can be a longitudinal wrapping, such that the overlapped region 77 is an axially overlapped region that extends substantially along an axial direction of elongation of the electrical cable 50, and thus of the ribbon 54.

The electrical cable ribbon 48 can further include an electrically conductive coating of the type described above that is disposed in the overlapped region 77. The electrical coating can be an anti-oxidation agent in some examples. The coating can be a paste, gel, adhesive, or any suitable alternative coating as described herein. The electrically conductive coating can be disposed in an entirety of the overlapped region. The electrically conductive coating can be applied to a substantial entirety of the radially inner end 76*a* of the wrapping. Alternatively or additionally, the electrically conductive coating can be applied to a substantial entirety of the radially outer 76*b* end of the wrapping 77. The electrical coating can be confined to the overlapped region.

With continuing reference to FIG. 9C, the electrical shield 58 can be disposed about the inner electrical insulator 54 of each electrical cable 50. For instance, the electrical shield 58 can abut the outer perimeter of the inner electrical insulator 54. Alternatively, each of the electrical cables 50 can include a coating that is applied to the radially outer end 54*b* of the inner electrical insulator 54 in the manner described above. Thus, the coating can be metallic. For instance, the coating can be made of silver, gold, copper, or alloys thereof. In this regard, the electrical shield 58 can abut the outer perimeter of the electrical coating. The electrical shield 58 can be laminated to the inner electrical insulator 54 or laminated to the electrically conductive coating applied to the inner electrical insulator 54.

The electrical cable ribbon 48 can further include an adhesive 67 that is disposed between the inner electrical insulator 54 and the electrical shield 58. The adhesive 67 can be an epoxy in one example, but can be configured as any suitable alternative adhesive as desired. The adhesive 67 can thus bond the electrical shield 58 to the inner electrical insulator 54 or to the electrically conductive coating, if present, that is applied to the inner electrical insulator 54. Accordingly, the electrical shield 58 can be laminated to the inner electrical insulator 54. In one example, the adhesive 67 can be configured as an electrically conductive material 68 of the type described herein. For instance, the electrically conductive material 68 can surround the inner electrical insulator 54. Further, the electrically conductive material 68 can be disposed between the electrical shield 58 and the drain wire 100. For instance, the electrically conductive material 68 can extend from the electrical shield 58 to the drain wire 100. Further still, the electrically conductive material 68 can be disposed in the interstices 59. The electrically conductive material 68 can place the drain wire 100 in electrical communication with the electrical shield 58. Alternatively, the drain wire 100 can be placed in contact with the electrical shield 58. In this regard, the adhesive 67 can be an electrically nonconductive in some examples. Thus, the at least one drain wire 100 can contact the electrical shield 58 so as to place the at least one drain wire 100 in electrical communication with the electrical shield 58.

The electrical shield 58 can define a first end 58*a* and a second end 58*b* opposite the first end 58*a*, such that each of the electrical conductor 52 and the electrical drain wire 100 are disposed between the first and second shield ends 58*a* and 58*b*. The electrically conductive material 68, and thus the adhesive 67, can include a first portion 68*a* and a second portion 68*b*. The first portion 68*a* can be disposed between the first shield end 58*a* to the inner electrical insulator 54 or the coating that surrounds the inner electrical insulator 54. In particular, the first portion 68*a* can extend from the first shield end 58*a* to the inner electrical insulator 54 or the coating that surrounds the inner electrical insulator 54. Thus, the first portion 68*a* can be in contact with the first shield end 58*a* and each of the electrical insulators 54 or the coating that surrounds the electrical insulators 54. Further, the first portion 68*a* can extend from the drain wire 100 to the first shield end 58*b*. Thus, the first portion 68*a* can be in contact with the first shield end 58*a* and the drain wire 100. The second portion 68*b* can be disposed between the second shield end 58*b* and each inner electrical insulator 54. In particular, the second portion 68*b* can extend from the second shield end 58*b* to the inner electrical insulator 54 or the coating that surrounds the inner electrical insulator 54. Thus, the second portion 68*b* can be in contact with the second shield end 58*b* and each inner electrical insulator. Further, the second portion 68*b* can extend from the drain wire 100 to the second shield end 58*b*. Thus, the second portion 68*b* can be in contact with the second shield end 58*b* and each drain wire 100. The first and second shield ends 58*a* and 58*b* can be oriented substantially parallel to each other along the axial direction.

The electrically conductive material 68 can further extend across the interstice 59. Accordingly, the electrically conductive material 68 can further be disposed between the first and second shield ends 58*a* and 58*b* in the interstices 59. For instance, the electrically conductive material 68 can extend from the first shield end 58*a* to the second shield end 58*b* in the interstices 59. Thus, the electrically conductive material 68 can be in contact with the first shield end 58*a* and the second shield end 58*b* in the interstices 59. The electrical cable braid 48 can define a necked location 61 at the interstices 59. The first and second shield ends 58*a* and 58*b* can extend toward each other at the necked location 61. In one example, the first and second shield ends 58*a* and 58*b* remain spaced from each other at the necked location 61. Alternatively, because the electrical shield 58 can be electrically conductive, the first and second shield ends 58*a* and 58*b* can alternatively contact each other at the necked locations.

The electrical shield 58 can include an electrically conductive wrapping 76 that defines a radially inner end 76*a* that faces the inner electrical insulator 54 and a radially outer end 76*b* that is opposite the radially inner end 76*a* (see FIGS. 7A-7B). The wrapping 76 can radially overlap itself so as to define an overlapped region 77. The wrapping 76 can be helically wrapped, such that the overlapped region 77 is a helical overlapped region as illustrated in FIG. 7A. For instance, the overlapped region 77 can define a plurality of revolutions about the inner electrical insulator 54. Alternatively, as illustrated in FIG. 7B, the wrapping 76 can be a longitudinal wrapping, such that the overlapped region 77 is an axially overlapped region that extends substantially along an axial direction of elongation of the electrical cable 50, and thus of the ribbon 54.

The electrical cable ribbon 48 can further include an electrically conductive coating of the type described above that is disposed in the overlapped region 77. The electrical coating can be an anti-oxidation agent in some examples. The coating can be a paste, gel, adhesive, or any suitable alternative coating as described herein. The electrically conductive coating can be disposed in an entirety of the overlapped region. The electrically conductive coating can be applied to a substantial entirety of the radially inner end 76*a* of the wrapping. Alternatively or additionally, the electrically conductive coating can be applied to a substantial entirety of the radially outer 76*b* end of the wrapping 77. The electrical coating can be confined to the overlapped region.

The cable ribbon 48 can further include the outer electrical insulator 55 of the type described above. The outer electrical insulator 55 can have first and second ends 57*a* and 57*b* that are opposite each other, and disposed such that the electrical shield 58 is disposed between the first end second ends 57*a* and 57*b* of the outer electrical insulator 55. The first end 57*a* of the outer electrical insulator 55 can extend along the first shield end 58*a*. In particular, the first end 57*a* of the outer electrical insulator 55 can extend along the radially outer end of the first shield end 58*a*. Similarly, the second end 57*b* of the outer electrical insulator 55 can extend along the second shield end 58*b*. In particular, the second end 57*a* of the outer electrical insulator 55 can extend along the radially outer end of the second shield end 58*b*.

The outer electrical insulator 55, including each of the first and second ends 57*a* and 57*b*, can further extend along interstices 59 that extend between adjacent ones of the electrical cables 50 of the electrical cable ribbon 48. In particular, the first and second ends 57*a* and 57*b* can extend toward each other at the necked locations 61, which can be located at the interstices 59. The outer electrical insulator 55 can be a single unitary structure. The outer electrical insulator 55 can be laminated to the electrical shield 58. For instance, the first and second ends 57*a* and 57*b* of the outer electrical insulator can be laminated to the first and second shield ends 58*a* and 58*b*, respectively, of the electrical shields 58. Alternatively, the outer electrical insulator 55 can be thermally bonded to the electrical shield 58. In particular, the first and second ends 57*a* and 57*b* of the outer electrical insulator 55 can be thermally bounded to the first and second ends 58*a* and 58*b* of the electrical shield. Alternatively still, the electrical cable ribbon 48 can be devoid of an outer electrical insulator 55. Thus, the radially outer end of the electrical shield 58 can define the radially outer end of the electrical cable braid 54.

While the electrical cable ribbon 54 has been described in accordance with certain examples as including the electrical shield 58, it should be appreciated that the electrical cable ribbon 54 can include a plurality of electrical shields of the type described in accordance with any of the electrical cable examples described above. Thus, the electrical cable ribbon 54 can include at least one electrical shield that surrounds the electrical shield 58 in some examples.

It should be appreciated that the illustrations and discussions of the embodiments shown in the figures are for exemplary purposes only, and should not be construed limiting the disclosure. One skilled in the art will appreciate that the present disclosure contemplates various embodiments. Additionally, it should be understood that the concepts described above with the above-described embodiments may be employed alone or in combination with any of the other embodiments described above. It should be further appreciated that the various alternative embodiments described above with respect to one illustrated embodiment can apply to all embodiments as described herein, unless otherwise indicated.

What is claimed:

1. A cable comprising:

an inner electrical insulator;

an electrically conductive wrapping wrapped about the inner electrical insulator, wherein the electrically conductive wrapping defines a radially inner end that faces the inner electrical insulator and a radially outer end that is opposite the radially inner end, and the wrapping radially overlaps itself so as to define first and second overlapping portions in an overlapped region; and an electrically conductive coating that is also an anti-oxidation agent disposed between the radially outer end and the radially inner end of the first and second overlapping portions, respectively, in the overlapped region, wherein the electrically conductive coating prevents oxidation of the electrically conductive wrapping, and wherein bending of the cable causes the first and second overlapping portions at the overlapped region to slide along each other.

2. The cable as recited in claim 1, wherein the electrically conductive wrapping comprises copper.

3. The cable as recited in claim 2, wherein the electrically conductive wrapping comprises a copper foil.

4. The cable as recited in claim 2, wherein the electrically conductive coating comprises a solid electrically conductive material.

5. The cable as recited in claim 4, wherein the electrically conductive material is non-flowable.

6. The cable as recited in any one of claim 2, wherein the coating is metallic.

7. The cable as recited in claim 6, wherein the coating comprises silver.

8. The cable as recited in claim 6, wherein the wrapping is helically wrapped about the inner electrical insulator, such that the overlapped region is a helical overlapped region.

9. The cable as recited in claim 6, wherein the wrapping is longitudinally wrapped about the inner electrical insulator, such that the overlapped region is an axially overlapped region substantially along the axial direction.

10. The cable as recited in claim 6, further comprising an outer electrical insulator that surrounds the wrapping.

11. The cable as recited in claim 7, further comprising an outer electrical insulator that surrounds the wrapping.

12. The cable as recited in claim 10, wherein the electrically conductive wrapping is a first electrically conductive wrapping, and the electrical cable further comprises a second electrically conductive wrapping that surrounds the first wrapping.

13. The cable as recited in claim 6 further comprising at least one electrical conductor that extends along an axial direction, wherein the inner electrical insulator surrounds the at least one electrical conductor along at least a portion of the length, and the electrically conductive wrapping provides electrical shielding to the at least one electrical conductor.

14. The cable as recited in claim 13, wherein the electrical conductor is a single electrical conductor that extends along a respective central axis, and the central axis is oriented along the axial direction.

15. The cable as recited in claim 13, comprising a twinaxial cable wherein the at last one electrical conductor comprises first and second electrical conductors that each extend along respective substantially parallel central axes that, in turn, are oriented along the axial direction.

16. The cable as recited in claim 1, wherein the electrically conductive coating comprises one of Umicore Sealing 691 EL, CNT, and chemically plated metallic nanoparticles.

17. The cable as recited in claim 1, wherein the inner electrical insulator comprises a foam.

18. The cable as recited in claim 1, wherein the electrically conductive material is flowable and configured to flow into interstices defined by adjacent windings of the electrically conductive wrapping.

* * * * *